(12) United States Patent
Myung et al.

(10) Patent No.: US 11,343,017 B2
(45) Date of Patent: May 24, 2022

(54) TRANSMITTER AND SIGNAL PROCESSING METHOD THEREOF

(71) Applicant: SAMSUNG ELECTRONICS CO., LTD., Suwon-si (KR)

(72) Inventors: Se-ho Myung, Yongin-si (KR); Kyung-joong Kim, Seoul (KR); Hong-sil Jeong, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/924,437

(22) Filed: Jul. 9, 2020

(65) Prior Publication Data

US 2020/0412477 A1 Dec. 31, 2020

Related U.S. Application Data

(63) Continuation of application No. 16/293,162, filed on Mar. 5, 2019, now Pat. No. 10,819,467, which is a
(Continued)

(30) Foreign Application Priority Data

Dec. 10, 2014 (KR) ........................ 10-2014-0177661

(51) Int. Cl.
*H04L 1/00* (2006.01)
*H03M 13/03* (2006.01)
(Continued)

(52) U.S. Cl.
CPC ........ *H04L 1/0041* (2013.01); *H03M 13/036* (2013.01); *H03M 13/1165* (2013.01);
(Continued)

(58) Field of Classification Search
CPC ... H04L 1/0041; H04L 1/0057; H04L 1/0071; H04L 2001/0093; H03M 13/255; H03M 13/27; H03M 13/1165; H03M 13/036
See application file for complete search history.

(56) References Cited

U.S. PATENT DOCUMENTS

| 9,225,358 B2 | 12/2015 | Park et al. |
| 9,621,190 B2 | 4/2017 | Park et al. |

(Continued)

FOREIGN PATENT DOCUMENTS

| KR | 10-2009-0026709 A | 3/2009 |
| KR | 10-2013-0135746 A | 12/2013 |
| WO | 2009075536 A2 | 6/2009 |

OTHER PUBLICATIONS

Communication issued Feb. 1, 2021 by the Korean Intellectual Property Office in corresponding y Korean Application No. 10-2014-0177661.
(Continued)

*Primary Examiner* — Guy J Lamarre
(74) *Attorney, Agent, or Firm* — Sughrue Mion, PLLC

(57) ABSTRACT

A transmitter is provided, which includes: an encoder configured to generate a low density parity check (LDPC) codeword comprising information word bits, first parity bits and second parity bits based on a parity check matrix; an interleaver configured to interleave the LDPC codeword; and a constellation mapper configured to map the interleaved LDPC codeword on constellation points, wherein the first parity bits are generated based on one of parity submatrices constituting the parity check matrix and the second parity bits are generated based on another of the parity submatrices constituting the parity check matrix.

10 Claims, 9 Drawing Sheets

Related U.S. Application Data continuation of application No. 14/962,077, filed on Dec. 8, 2015, now Pat. No. 10,263,731.

(51) Int. Cl.
  *H03M 13/11* (2006.01)
  *H03M 13/25* (2006.01)
  *H03M 13/27* (2006.01)
(52) U.S. Cl.
  CPC ......... *H03M 13/255* (2013.01); *H03M 13/27* (2013.01); *H04L 1/0057* (2013.01); *H04L 1/0071* (2013.01); *H04L 2001/0093* (2013.01)

(56) References Cited

U.S. PATENT DOCUMENTS

| | | | |
|---|---|---|---|
| 9,831,896 | B2 | 11/2017 | Park et al. |
| 10,236,912 | B2 | 3/2019 | Park et al. |
| 10,263,731 | B2 | 4/2019 | Myung et al. |
| 10,715,179 | B2 | 7/2020 | Park et al. |
| 2006/0195752 | A1 | 8/2006 | Walker et al. |
| 2009/0063929 | A1 | 3/2009 | Jeong et al. |
| 2009/0070652 | A1 | 3/2009 | Myung et al. |
| 2011/0047435 | A1 | 2/2011 | Eroz et al. |
| 2013/0223561 | A1 | 8/2013 | Trachewsky et al. |
| 2014/0157079 | A1 | 6/2014 | Park et al. |
| 2016/0056986 | A1* | 2/2016 | Shin .................. H04L 27/2646 375/260 |
| 2016/0072524 | A1 | 3/2016 | Park et al. |
| 2017/0063396 | A1* | 3/2017 | Park ...................... H04L 1/0058 |
| 2018/0048330 | A1 | 2/2018 | Park et al. |
| 2019/0158118 | A1 | 5/2019 | Park et al. |

OTHER PUBLICATIONS

Communication dated Aug. 20, 2020 issued by the Korean Intellectual Property Office in counterpart Korean Application No. 10-2014-0177661.

Chen et al. "Bit-cooperative coded modulation," IEEE, PP3136-3168; 2013.

Communication dated Apr. 29, 2016, issued by the International Searching Authority in counterpart International Application No. PCT/KR2015/013522 (PCT/ISA/210 & (PCT/ISA/237).

* cited by examiner

TRANSMITTER AND SIGNAL PROCESSING METHOD THEREOF

CROSS-REFERENCE TO RELATED APPLICATION

This is a continuation of U.S. patent application Ser. No. 16/293,162, filed Mar. 5, 2019, in the U.S. Patent and Trademark Office, which application is a continuation of U.S. application Ser. No. 14/962,077 filed Dec. 8, 2015, which claims priority from Korean Patent Application No. 10-2014-0177661, filed on Dec. 10, 2014 in the Korean Intellectual Property Office, the disclosure of which is incorporated herein by reference in its entirety.

BACKGROUND

1. Field

Devices and methods consistent with what is disclosed herein relate to a transmitter and a signal processing method thereof, and more specifically, to a transmitter configured to process and transmit data according to an incremental redundancy (IR) manner, and a signal processing method thereof.

2. Description of the Related Art

In the $21^{st}$-century information society, the broadcasting communication service is entering stages of digitalization, multichannel establishment, broadband network, and high quality. Specifically, as supplies of high definition digital television (TV), portable media player (PMP), and mobile broadcasting devices are increasingly used, the digital broadcasting communication service also faces increasing demands for diverse manners of supporting reception of the digital broadcasting communication.

To meet these demands, the standardization groups have implemented various standards and provide various services.

When data is transmitted through wireless channels to a receiver, data may have errors because of fading and thermal noise. Accordingly, various methods are proposed to enhance effectiveness in correcting the errors that may occur to the received data, and one of these methods is to transmit and receive signals in an incremental redundancy (IR) manner.

The IR method increases the reception success rate by additionally transmitting encoded data which are not used during the transmission, thus reducing the code rate of the received data in the receiver.

Therefore, it is necessary to discuss a method that can provide better services to users by applying the IR method.

SUMMARY

Exemplary embodiments of the present inventive concept may overcome the above disadvantages and other disadvantages not described above. Also, the present inventive concept is not required to overcome the disadvantages described above, and the exemplary embodiments of the present inventive concept may not overcome any of the problems described above.

According to an exemplary embodiment, a technical objective is to provide a transmitter which processes and transmits signals according to the IR method in order to enhance a reception performance and a signal processing method thereof.

According to an exemplary embodiment, there is provided a transmitter which may include: an encoder configured to generate a low density parity check (LDPC) codeword comprising information word bits, first parity bits and second parity bits based on a parity check matrix; an interleaver configured to interleave the LDPC codeword; and a constellation mapper configured to map the interleaved LDPC codeword on constellation points, wherein the first parity bits are generated based on one of parity submatrices constituting the parity check matrix and the second parity bits are generated based on another of the parity submatrices constituting the parity check matrix.

The parity check matrix may include a plurality of information word submatrices and a plurality of parity submatrices, and each of the information word submatrices comprises a plurality of column groups each of which comprises M number of columns.

In each column group of a first information word submatrix among the information word submatrices, a column may be cyclic-shifted from a previous column by a first cyclic shift value, and in each column group of a second information word submatrix, a column may be cyclic-shifted from a previous column by a second cyclic shift value.

In each of the information word matrices, an index of a row having a $k^{th}$ 1 in a $i^{th}$ column in an $i^{th}$ column group may be determined based on a number of rows having 1 in a column, a number of columns in each column group, a number of information word bits, a number of the first parity bits, a number of the second parity bits, and the first and second cyclic shift values, where i, j and k are an integer value greater than or equal to 0.

If an index of a row in a $0^{th}$ column of a given column group is less than the number of the first parity bits, indexes of rows having 1 in a next column group may be determined by the first cyclic-shift value. However, if the index of the row in the $0^{th}$ column of the given column group is greater than or equal to the number of the first parity bits, the indexes of the rows having 1 in the next column group may be determined by the second cyclic-shift value.

The plurality of parity submatrices may include: first parity submatrices which are not adjacent to each other and have a dual diagonal matrix structure; and second parity submatrices which are zero matrices.

The first parity bits may be generated based on one of the first parity submatrices having the dual diagonal structure, and the second parity bits may be generated based on another of the first parity submatrices having the dual diagonal structure.

The encoder may be configured to generate the first parity bits based on indexes of rows having 1 in a $0^{th}$ column in an $0^{th}$ column group, and each of the first parity bits may be generated by a binary operation between the each parity bit and an immediately previous parity bit.

The plurality of parity submatrices may include: at least one submatrix having a dual diagonal matrix structure; at least one submatrix having an identity matrix structure; and at least one zero matrix.

The first parity bits may be generated based on the parity submatrix having the dual diagonal structure, and the second parity bits may be generated based on the parity submatrix having the identity matrix structure.

The encoder may generate the first and second parity bits by using predetermined equations.

The interleaver may include a first interleaver configured to interleave the information word bits and the first parity bits, and a second interleaver configured to interleave the second parity bits.

The constellation mapper may include: a first constellation mapper configured to map the interleaved information word bits and the first parity bits on first constellation points; and a second constellation mapper configured to map the interleaved second parity bits on second constellation points.

The transmitter may additionally include a bit selector configured to output certain bits from the information word bits and the first parity bits to the second interleaver so that the certain bits from the information word bits and the first parity bits, along with the second parity bits, are mapped on the second constellation points.

The number of the second parity bits may be smaller than the number of the first parity bits.

The bit selector may select the certain bits from the information word bits and the first parity bits based on a ratio of a sum of a number of the information word bits and a number of the first parity bits, to a number of the second parity bits, and output the selected bits to the second interleaver.

The bit selector may select a group of certain bits from the information word bits and the first parity bits based on a ratio of a sum of the number of the information word bits and the number of the first parity bits, to the number of the second parity bits, and output the selected bit group to the second interleaver.

According to an exemplary embodiment, there is provided a signal processing method of a transmitter which may include: generating a low density parity check (LDPC) codeword comprising information word bits, first parity bits and second parity bits based on a parity check matrix; interleaving the LDPC codeword; and mapping the interleaved LDPC codeword on constellation points, wherein the first parity bits are generated based on one of parity submatrices constituting the parity check matrix and the second parity bits are generated based on another of the parity submatrices constituting the parity check matrix.

The parity check matrix may include a plurality of information word submatrices and a plurality of parity submatrices, and each of the information word submatrices comprises a plurality of column groups each of which comprises M number of columns.

M may be common divisor of $N_{ldpc1}$, $N_{ldpc2}$ and $K_{ldpc}$, and satisfy:

$$M=(N_{ldpc1}-K_{ldpc})/Q_{ldpc}=(N_{ldpc2}-K_{ldpc})/Q_{ldpc2}$$

M may be 360.

The information word submatrix may determine positions of 1 in a $0^{th}$ column of each of the plurality of the column groups according to a predetermined table.

The plurality of parity submatrices may include: first parity submatrices which are not adjacent to each other and have a dual diagonal matrix structure; and second parity submatrices which are zero matrices.

The first parity bits may be generated based on one of the first parity submatrices having the dual diagonal structure, and the second parity bits may be generated based on another of the first parity submatrices having the dual diagonal structure.

The generating LDPC codeword may generate the first and second parity bits by using predetermined equations.

The plurality of parity submatrices may include: at least one submatrix having a dual diagonal matrix structure; at least one submatrix having an identity matrix structure; and at least one zero matrix.

The first parity bits may be generated based on the parity submatrix having the dual diagonal structure, and the second parity bits may be generated based on the parity submatrix having the identity matrix structure.

The first parity bits may be generated based on indexes of rows having 1 in a $0^{th}$ column in an $0^{th}$ column group, and each of the first parity bits may be generated by a binary operation between the each parity bit and an immediately previous parity bit.

The interleaving may interleave the information word bits and the first parity bits by using a first interleaver, and interleave the second parity bits by using a second interleaver.

The mapping may map the output of the first interleaver on first constellation points by using a first constellation mapper, and map the output of the second interleaver on second constellation points by using a second constellation mapper.

The signal processing method may additionally include outputting certain bits from the information word bits and the first parity bits to the second interleaver so that the certain bits from the information word bits and the first parity bits, along with the second parity bits, are mapped on the second constellation points.

The number of the second parity bits may be smaller than the number of the first parity bits.

The outputting may select the certain bits from the information word bits and the first parity bits based on a ratio of a sum of a number of the information word bits and a number of the first parity bits, to a number of the second parity bits, and output the selected bits to the second interleaver.

The outputting may select a group of certain bits from the information word bits and the first parity bits based on a ratio of a sum of the number of the information word bits and the number of the first parity bits, to the number of the second parity bits, and output the selected bit group to the second interleaver.

According to the various exemplary embodiments, the decoding performance of a receiver can be enhanced.

BRIEF DESCRIPTION OF DRAWINGS

The above and/or other aspects of the present inventive concept will be more apparent by describing certain exemplary embodiments of the present inventive concept with reference to the accompanying drawings, in which.

DETAILED DESCRIPTION OF EXEMPLARY EMBODIMENTS

Figure 1:
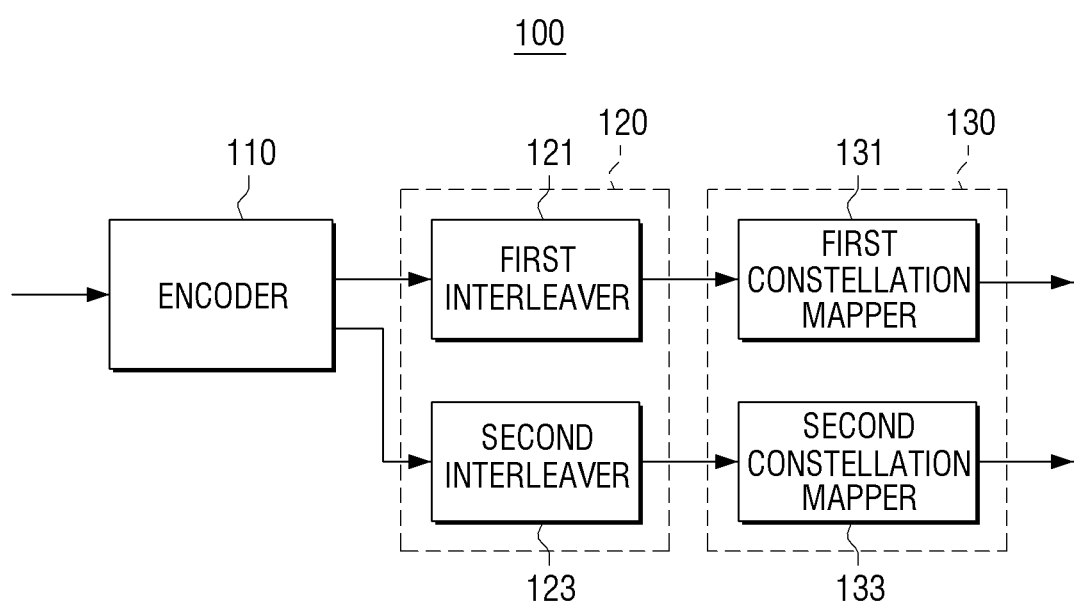
FIGS. 1 and 7 are block diagrams related to a transmitter according to an exemplary embodiment.

Certain exemplary embodiments of the inventive concept will now be described in greater detail with reference to the accompanying drawings.

In the following description, same drawing reference numerals are used for the same elements even in different drawings. The matters defined in the description, such as detailed construction and elements, are provided to assist in a comprehensive understanding of the inventive concept. Accordingly, it is apparent that the exemplary embodiments of the inventive concept can be carried out without those specifically defined matters. Also, well-known functions or constructions are not described in detail since they would obscure the inventive concept with unnecessary detail.

FIG. 1 is a block diagram of a transmitter according to an exemplary embodiment.

The transmitter 100 may transmit data to a receiver using an incremental redundancy (IR) method.

The IR method enhances the reception success rate by additionally transmitting encoded data which are not used during the transmission, thereby reducing a code rate of the received data in the receiver. Thus, according to the IR method, the transmitter may generate an additional parity when encoding the data to be transmitted, and transmit the original encoded data, which does not include the additional parity, along with the additional parity.

For example, when n bits of data are converted into m number of symbols through channel coding, the transmitter may transmit a part of m number of the symbols and retransmit the remaining part, or simultaneously transmit the part and the remaining part of m number of the symbols through separate channels. Therefore, the receiver may perform error correction by adding, to a later section of an encoded block corresponding to the part, another encoded block corresponding to the remaining part.

The following will explain constitution of the transmitter 100 transmitting data according to the IR method as described above by referring to FIG. 1. Lengths of a low density parity check (LDPC) codeword, information word bits and parity bits may respectively indicate a number of bits constituting the LDPC codeword, the information word bits and the parity bits.

Referring to FIG. 1, the transmitter 100 may include an encoder 110, an interleaver 120 and a constellation mapper 130.

The encoder 110 may generate an LDPC codeword including information word bits, the first parity bits and the second parity bits based on a parity check matrix. For the above, the encoder 110 may include an LDPC encoder (not illustrated) for LDPC encoding.

Specifically, the encoder 110 may generate first parity bits (i.e., first LDPC parity bits) and second parity bits (i.e., second LDPC parity bits) by performing LDPC encoding on input bits as information word bits (i.e., data). Further, the encoder 110 may generate an LDPC codeword including the first parity bits and the second parity bits. The encoder 110 may output the LDPC codeword to the interleaver 120.

Here, because the encoder 110 may perform LDPC encoding systematically, the LDPC codeword may take a form in which the parity bits are added to the information word bits.

The LDPC codeword generated by LDPC encoding may include the information word bits, the first parity bits and the second parity bits. Here, the information word bits and the first parity bits may correspond to encoded data that are initially transmitted in the IR method, and the second parity bits may correspond to an additional parity that is additionally transmitted in the IR method.

For example, the encoder 110 may encode the information word bits constituted with $K_{ldpc}$ number of bits ($i_0, i_1, i_2, \ldots, i_{K_{ldpc}-1}$), and generate ($i_0, i_1, i_2, \ldots, i_{K_{ldpc}-1}, p_0, p_1, p_2, \ldots, p_{N_{ldpc1}-K_{ldpc}-1}, p_{N_{ldpc1}-K_{ldpc}}, p_{N_{ldpc1}-K_{ldpc}+1}, \ldots, p_{N_{ldpc}-K_{ldpc}-1}$).

In this case, the information word bits ($i_0, i_1, i_2, \ldots, i_{K_{ldpc}-1}$), and the first parity bits ($p_0, p_1, p_2, \ldots, p_{N_{ldpc1}-K_{ldpc}-1}$) may be the encoded data to be initially transmitted in the IR method, and the second parity bits ($p_{N_{ldpc1}-K_{ldpc}+1}, \ldots, p_{N_{ldpc}-K_{ldpc}-1}$) may be additional parity bits to be transmitted additionally in the IR method.

Here, the length of the LDPC codeword may be $N_{ldpc}$, the length of the information word bits may be $K_{ldpc}$, the length of the first parity bit may be $N_{ldpc1}-K_{ldpc}$, and the length of the second parity bits may be $N_{ldpc2}-K_{ldpc}$. Therefore, $N_{ldpc}=N_{ldpc1}+N_{ldpc2}-K_{ldpc}$ may be satisfied.

The encoder 110 may use the parity check matrix when performing the LDPC encoding because an LDPC encoding process is to generate an LDPC codeword, C satisfying $H \cdot C^T = 0$ with respect to the parity check matrix, H.

Figure 2:
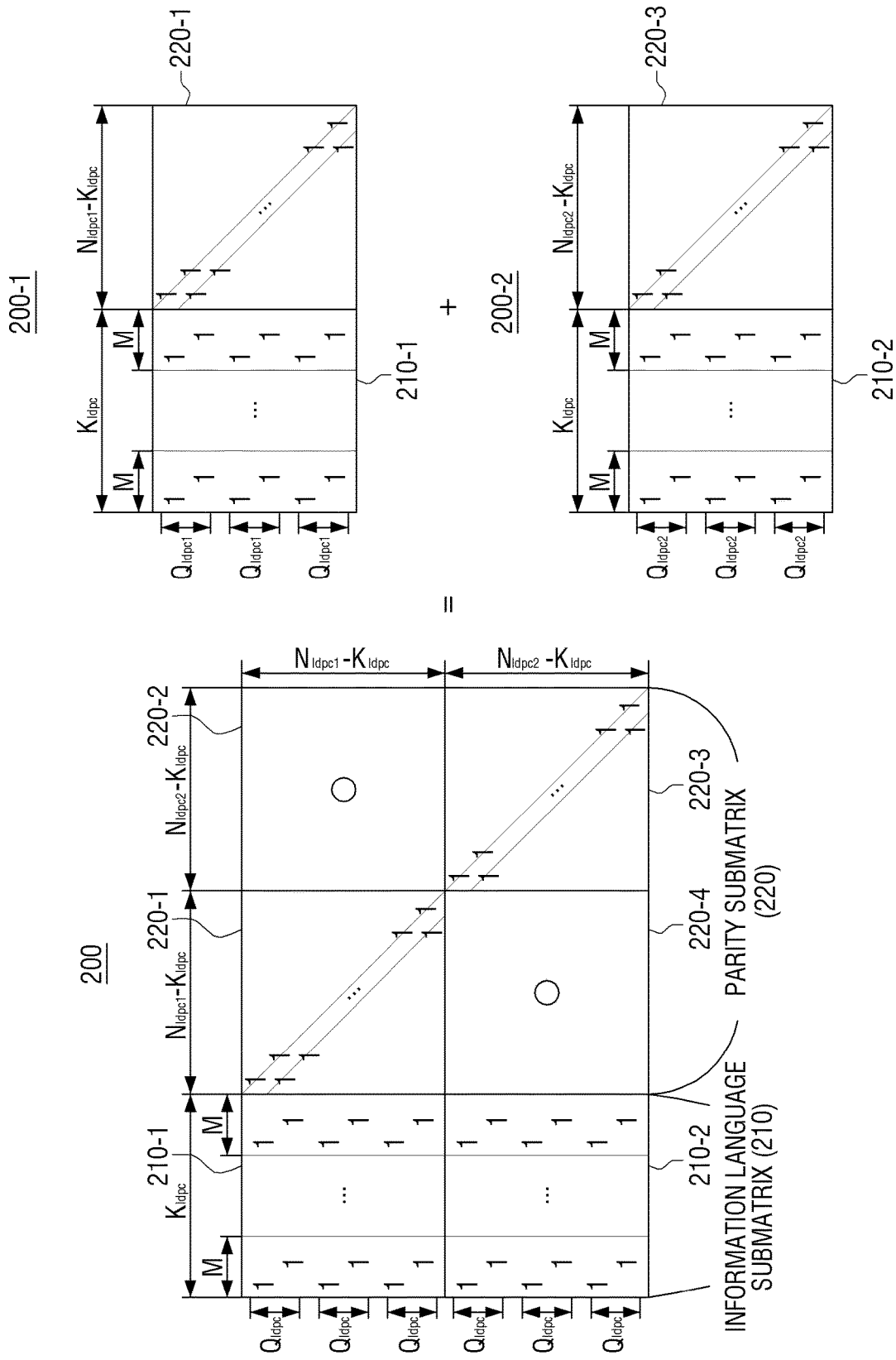
FIGS. 2 to 5 illustrate structures of a parity check matrix according to an exemplary embodiment.
Figure 3:
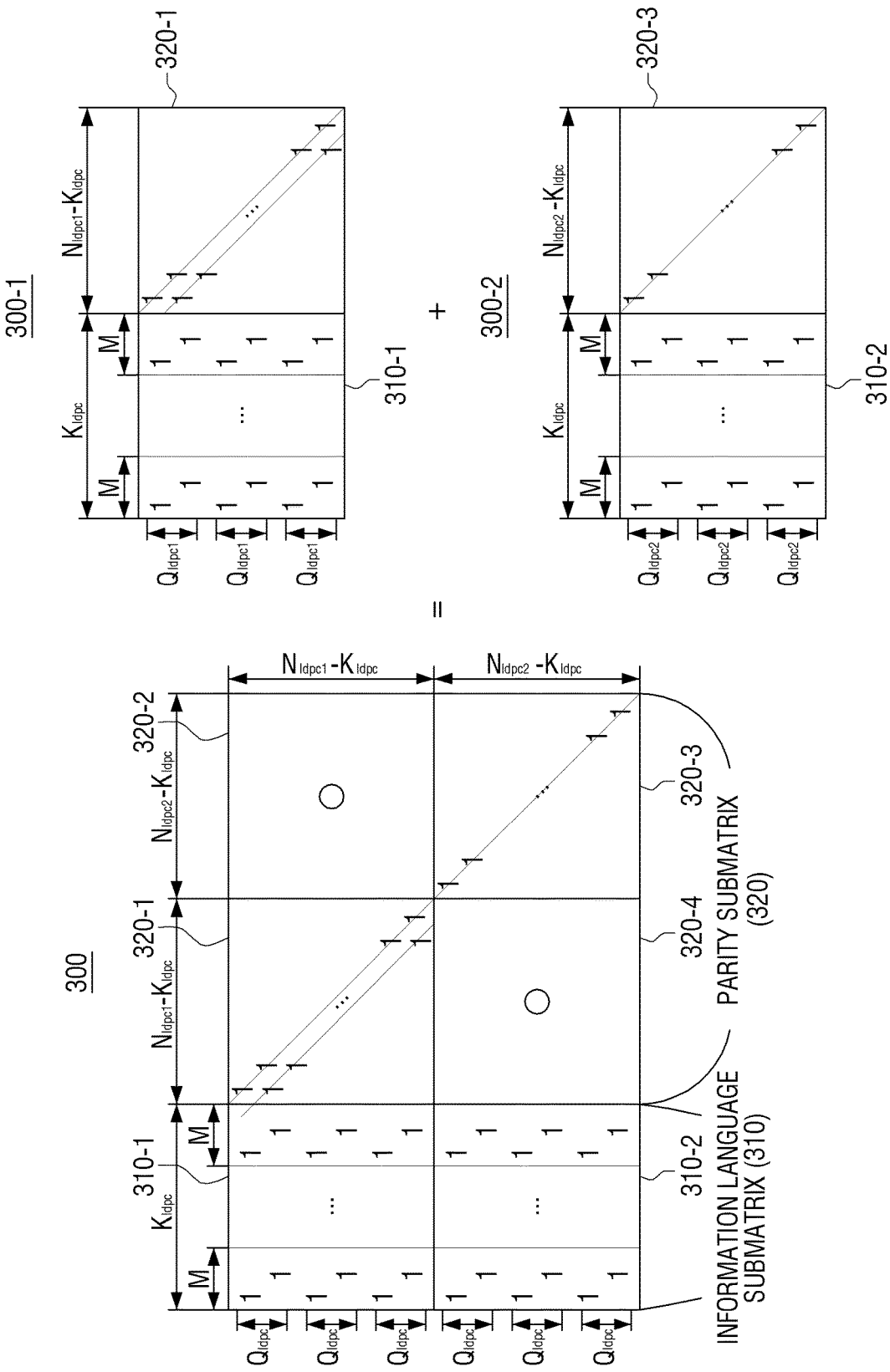

The following will explain the parity check matrix H used in the LDPC encoding according to an exemplary embodiment by referring to FIGS. 2 and 3.

Referring to FIGS. 2 and 3, a parity check matrix (200, 300) may include an information word submatrix (or information word matrix) (210, 310) and a parity submatrix (or parity matrix) (220, 320), Elements other than 1 in the parity check matrix (200, 300) may be 0.

Specifically, the information word submatrix (210, 310) may include $K_{ldpc}$ number of columns, and the parity submatrix (220, 320) may include $(N_{ldpc1}-K_{ldpc})+(N_{ldpc2}-K_{ldpc})$ number of columns. Thus, the information word submatrix (210, 310) may include columns from 0 to $K_{ldpc}-1$ of the parity check matrix (200, 300), and the parity submatrix (220, 320) may include columns from $K_{ldpc}$ to $N_{ldpc1}+N_{ldpc2}-K_{ldpc}-1$ of the parity check matrix (200, 300).

In this case, the information word submatrix (210, 310) may be constituted with as many columns as the number of the information word bits, and the parity submatrix (220, 320) may be constituted with as many columns as the number of the parity bits.

Thus, referring to FIGS. 2 and 3, because the information word submatrix (210, 310) is constituted with $K_{ldpc}$ number of columns, an LDPC codeword generated by the parity check matrix (200, 300) may include the information word bits constituted with $K_{ldpc}$ number of bits. Further, because the parity submatrix (220, 320) is constituted with $(N_{ldpc1}-K_{ldpc})+(N_{ldpc2}-K_{ldpc})$ number of columns, an LDPC codeword generated by the parity check matrix (200, 300) may include the parity bits constituted with $(N_{ldpc1}-K_{ldpc})+(N_{ldpc2}-K_{ldpc})$ number of bits.

Here, the parity bits may include the first parity bits constituted with $N_{ldpc1}-K_{ldpc}$ number of bits and the second parity bits constituted with $N_{ldpc2}-N_{ldpc1}$ number of bits.

A number of rows in the parity check matrix (200, 300) is the same as a number of columns in the parity submatrix (220, 320). Thus, the parity check matrix (200, 300) may be constituted with $(N_{ldpc1}-K_{ldpc})+(N_{ldpc2}-K_{ldpc})$ number of rows.

The following will explain a structure of the parity check matrix (200, 300).

Referring to FIG. 2, the parity check matrix (200) will be first described below.

As illustrated in FIG. 2, the parity check matrix (200) may have a form in which a parity check matrix (200-1) and a parity check matrix (200-2) are concatenated with each other.

Therefore, when structures of an information word submatrix (210-1) of the parity check matrix (200-1) and an information word submatrix (210-2) of the parity check matrix 200-2 are respectively determined, a structure of the information word submatrix 210 of the parity check matrix 200 may be determined. The following will describe respectively the structures of the information word submatrix 210-1 of the parity check matrix 200-1 and the information word submatrix 210-2 of the parity check matrix 200-2.

The information word submatrix 210-1 of the parity check matrix 200-1 may include columns from 0 to $K_{ldpc}-1$, and follow a rule described below.

First, $K_{ldpc}$ number of columns constituting the information word submatrix 210-1 may be divided into $K_{ldpc}/M$ number of column groups. Here, $M=M_1=360$, for example. In this case, adjacent two columns belonging to a same column group may have a relationship of cyclic shift by $Q_{ldpc1}$ to each other.

Herein, M is an interval in which a pattern of columns included in a same column group repeats in the information word submatrix (210-1), and $Q_{ldpc1}$ is distance in which each column is cyclic-shifted in the same column group of the information word submatrix (210-1). M and $Q_{ldpc1}$ may be integers, determined so as to meet $Q_{ldpc1}=(N_{ldpc1}-K_{ldpc})/M$, and different according to the length of LDPC codeword and the code rate. $N_{lcpc1}$ may be the length of an LDPC codeword generated when LDPC encoding is performed based on the parity check matrix (200-1), $K_{ldpc}$ may be the length of the information word bits, and $N_{ldpc1}-K_{ldpc}$ may be the length of the parity bits.

Secondly, when a degree of a $0^{th}$ column of an $i^{th}$ column group (i=0, 1, . . . , $K_{ldpc}/M-1$) is $D_i$ (herein, the 'degree' is a number of rows having 1 in a column, and degrees of columns belonging to a same column group are the same), and when a position of each row having 1 is $R_{1,0}^{(0)}$, $R_{1,0}^{(1)}$, . . . , $R_{1,0}^{(D_i-1)}$, an index $R_{i,j}^{(k)}$ of a row having a $k^{th}$ 1 in a $j^{th}$ column in an $i^{th}$ column group may be determined based on following Equation 1.

$$R_{i,j}^{(k)}=R_{i,(j-1)}^{(k)}+Q_{ldpc1}\mathrm{mod}(N_{ldpc1}-K_{ldpc}), \quad (1)$$

where k=0, 1, 2, . . . , $D_i-1$, i=0, 1, . . . $K_{ldpc}/M-1$, and j=0, 1, 2, . . . , M-1.

Equation 1 may be represented by following Equation 2.

$$R_{i,j}^{(k)}=\{R_{i,0}^{(k)}+(j \bmod M)\times Q_{ldpc1}\} \bmod(N_{ldpc1}-K_{ldpc}), \quad (2)$$

where k=0, 1, 2, . . . , $D_i-1$, i=0, 1, . . . , $K_{ldpc}/M-1$, and j=0, 1, 2, . . . , M-1.

Referring to Equation 2, an index of a row having $k^{th}$ 1 in a $j^{th}$ column in an $i^{th}$ column group may be obtained, provided that $R_{i,0}^{(k)}$ is given. Thus, when an index value of a row having a $k^{th}$ 1 in a $0^{th}$ column in each column group is stored, positions regarding rows and columns where weight-1 is present may be known in the information word submatrix (210-1).

According to the above rule, all the degrees of the columns belonging to an $i^{th}$ column group are uniformly $D_i$. Therefore, LDPC codes storing information about the parity check matrix may be briefly expressed below according to the above rules.

For example, when $N_{ldpc1}$ is 30, $K_{ldpc}$ is 15, and $Q_{ldpc1}$ is 3, information about positions of a row where weight-1 is present in a $0^{th}$ column of the three column groups may be expressed to be sequences of following mathematical Equations 3, and referred to as a weight-1 position sequence.

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \quad (3)$$

where, $R_{i,j}^{(k)}$ indicates index of a row having a $k^{th}$ 1 in a $j^{th}$ column in an ith column group.

The weight-1 position sequences of Equations 3 indicating an index of a row having 1 in a $0^{th}$ column in each column group may be further briefly represented by following Table 1.

TABLE 1

| |
|---|
| 1 2 8 10 |
| 0 9 13 |
| 0 14 |

Table 1 indicates positions of elements having weight-1 in the parity check matrix, in other words, having 1. An $i^{th}$ weight-1 position sequence may be expressed by indexes of rows where the weight-1 is present in a $0^{th}$ column belonging to an $i^{th}$ column group.

Based on the above description, the information word submatrix 210-1 of the parity check matrix according to an exemplary embodiment may be determined to be following Table 2.

Specifically, the information word submatrix 210-1 may be constituted with a plurality of column groups respectively including M number of columns, and a position of 1 in a $0^{th}$ column of each of the plurality of column groups may be represented by Table 2. Thus, positions of 1 respectively placed in an $M^{th}$ column may be represented by Table 2. In this case, $N_{ldpc1}$ is 16200, $K_{ldpc\ is}$ 11880, the code rate is 11/15, M is 360, and $Q_{ldpc1}$ is 12.

TABLE 2

| i | Indexes of rows having 1 On 0th column of ith column group |
|---|---|
| 0 | 108 297 703 742 1345 1443 1495 1628 1812 2341 2559 2669 2810 2877 3442 3690 3755 3904 4264 7544 10480 15676 16095 17842 |
| 1 | 180 211 477 788 824 1090 1272 1578 1685 1948 2050 2195 2233 2546 2757 2946 3147 3299 3544 8426 11058 13722 17105 19486 |
| 2 | 627 741 1135 1157 1226 1333 1378 1427 1454 1696 1757 1772 2099 2208 2592 3354 3580 4066 4242 5032 5554 14994 17211 18329 |
| 3 | 9 795 959 989 1006 1032 1135 1209 1382 1484 1703 1855 1985 2043 2629 2845 3136 3450 3742 7591 7738 11448 15021 19919 |
| 4 | 230 413 801 829 1108 1170 1291 1759 1793 1827 1976 2000 2423 2466 2917 3010 3600 3782 4143 5443 10754 14142 17813 20453 |
| 5 | 56 142 236 381 1050 1141 1372 1627 1985 2247 2340 3023 3434 3519 3957 4013 4142 4164 4279 7097 10152 12882 14468 17279 |
| 6 | 298 1211 2548 3643 4875 7960 11672 16044 16878 |
| 7 | 73 1070 1614 1748 6216 7768 13481 15225 18512 |
| 8 | 1439 2141 3614 11710 14771 15515 16418 18167 |
| 9 | 284 1564 2629 8508 8623 9598 15713 18675 |

TABLE 2-continued

| i | Indexes of rows having 1 On 0th column of ith column group |
|---|---|
| 10 | 607 660 855 9991 10233 11029 18440 19224 |
| 11 | 1195 2037 2753 4972 6032 6590 6701 7448 |
| 12 | 49 1198 2562 10955 13383 14136 16605 19071 |
| 13 | 296 1145 3540 4468 16304 16899 19470 20306 |
| 14 | 1516 2315 2382 6031 6496 10185 12697 19527 |
| 15 | 154 722 4016 5940 7936 13893 14650 18952 |
| 16 | 759 2375 3825 8334 9484 10722 14742 14856 |
| 17 | 162 194 1749 7475 10487 13654 17265 19858 |
| 18 | 2335 2422 2632 5410 6559 12929 13570 14339 16186 |
| 19 | 6 1172 2583 5282 9339 11317 12459 15836 17283 |
| 20 | 726 1325 1428 8680 9393 13667 14092 15793 20322 |
| 21 | 985 2708 2769 4760 5960 13632 13942 17734 18171 |
| 22 | 255 2801 3181 4325 6797 7194 12085 13798 13909 |
| 23 | 2979 3720 4090 4341 4846 13148 13268 17081 19360 |
| 24 | 208 1428 4094 4582 7181 8751 12464 18669 20239 |
| 25 | 199 3743 3757 4834 5793 9516 10628 10959 19661 |
| 26 | 1229 2059 4282 7520 10884 11556 12589 14628 16017 |
| 27 | 458 1100 1387 6932 9777 14498 14857 16780 20040 |
| 28 | 1199 2481 3284 4506 5623 7940 15787 19015 19478 |
| 29 | 1161 1467 4060 5742 10620 11006 14891 18058 18640 |
| 30 | 959 3014 4144 11555 15242 16177 16754 17443 17761 |
| 31 | 2666 3960 4125 6679 6946 9332 10188 10469 18904 |
| 32 | 2809 3834 4318 7434 8130 15391 15818 16919 19181 |

Table 2 indicates indexes of rows having 1 on a $0^{th}$ column in an $i^{th}$ column group in the information word submatrix (210-1).

Thus, the information word submatrix (210-1) may be constituted with 33 column groups respectively including 360 columns, and positions of 1 in a $0^{th}$ column of each column group may be determined according to Table 2 described above. For example, regarding a $0^{th}$ column of a $0^{th}$ column group, 1 may be present on a $108^{th}$ row, a $297^{th}$ row, a $703^{rd}$ row, etc.

Further, positions of rows having 1 in a column of a column group may be determined by cyclic-shifting positions of rows having 1 in another column next to the column in the same column group by $Q_{ldpc1}$.

Specifically, referring to Table 2, $Q_{ldpc1}$ is 12, and indexes of rows having 1 in a $0^{th}$ column of a $0^{th}$ column group are 108, 297, 703, etc. Thus, indexes of rows having 1 in a $1^{st}$ column of the $0^{th}$ column group may be 120 (=108+12), 309 (=297+12), 715 (=703+12), etc., and indexes of rows having 1 in a $2^{nd}$ column of a $0^{th}$ column group may be 132 (=120+12), 321 (=309+12), 727 (=715+12), etc.

According to the above method, positions of rows having 1 in columns of each column group in the information word submatrix (210-1) may be determined.

The information word submatrix (210-2) may be determined according to the method applied to the information word submatrix (210-1).

Therefore, $K_{ldpc}$ number of columns constituting the information word submatrix (210-1) may be divided into $K_{ldpc}/M$ number of column groups. Here, $M=M_2=360$, for example. However, in the information word submatrix (210-2), $Q_{ldpc}$ value may be $Q_{ldpc2}$, not $Q_{ldpc1}$. Thus, adjacent two columns belonging to a same column group in the information word submatrix (210-2) may have a relationship of cyclic shift by $Q_{ldpc2}$ to each other. Herein, M and $Q_{ldpc2}$ may be integers, and determined so as to meet $Q_{ldpc2}=(N_{ldpc2}-K_{ldpc})/M$. Herein, $N_{ldpc2}$ may be the length of an LDPC codeword generated when LDPC encoding is performed based on the parity check matrix (210-2), $K_{ldpc}$ may be the length of the information word bits, and $N_{ldpc2}-K_{ldpc}$ may be length of the parity bits.

Therefore, above Equations 1 and 2 may be respectively expressed as be Equations 4 and 5 below.

$$R_{i,j}^{(i)} = R_{i,(j-1)}^{(k)} + Q_{ldpc2} \bmod(N_{ldpc2} - K_{ldpc}), \qquad (4)$$

where $k=0, 1, 2, \ldots, D_i-1$, $i=0, 1, \ldots, K_{ldpc}/M-1$, and $j=0, 1, 2, \ldots, M-1$.

$$R_{i,j}^{(k)} = \{R_{i,0}^{(k)} + (j \bmod M) \times Q_{ldpc2}\} \bmod(N_{ldpc2} - K_{ldpc}), \qquad (5)$$

where $k=0, 1, 2, \ldots, D_i-1$, $i=0, 1, \ldots, K_{ldpc}/M-1$, and $j=0, 1, 2, \ldots, M-1$.

Referring to Equation 5, index of a row having a $k^{th}$ 1 in a $j^{th}$ column in an $i^{th}$ column group may be obtained provided that $R_{i,0}^{(k)}$ is given. Therefore, when an index value of a row having a $k^{th}$ 1 in a $0^{th}$ column in each column group is stored, positions of columns and rows where weight-1 is present may be known in the information word submatrix (210-2).

Based on the above description, the information word submatrix (210-2) of the parity check matrix according to an exemplary embodiment may be determined as following Table 3.

Specifically, the information word submatrix (210-2) may be constituted with a plurality of column groups respectively including M number of columns, and positions of 1 in a $0^{th}$ column in each column group may be determined to be Table 3. In this case, $N_{ldpc2}$ is 28080, $K_{ldpc}$ is 11880, the code rate is 11/26, M is 360, and $Q_{ldpc2}$ is 45.

TABLE 3

| i | Indexes of rows having 1 On 0th column of ith column group |
|---|---|
| 0 | 3224 6160 11356 11775 13522 |
| 1 | 4106 6738 9402 12785 15166 |
| 2 | 712 1234 10674 12891 14009 |
| 3 | 3271 3418 7128 10701 15599 |
| 4 | 1123 6434 9822 13493 16133 |
| 5 | 2777 5832 8562 10148 12959 |
| 6 | 555 3640 7352 11724 12558 |
| 7 | 1896 3448 9161 10905 14192 |
| 8 | 7390 10451 11195 12098 13847 |
| 9 | 4188 4303 5278 11393 14355 |
| 10 | 5671 5913 6709 14120 14904 |
| 11 | 652 1712 2270 2381 3128 |
| 12 | 6635 9063 9816 12285 14751 |

TABLE 3-continued

| i | Indexes of rows having 1 On 0th column of ith column group |
|---|---|
| 13 | 148 11984 12579 15150 15986 |
| 14 | 1711 2176 5865 8377 15207 |
| 15 | 1620 3616 9573 10330 14632 |
| 16 | 4014 5164 6402 10422 10536 |
| 17 | 3155 6167 9334 12945 15538 |
| 18 | 1090 2239 8609 9250 10019 11866 |
| 19 | 962 5019 6997 8139 11516 12963 |
| 20 | 4360 5073 9347 9772 11473 16002 |
| 21 | 440 1640 9312 9622 13414 13851 |
| 22 | 5 2477 2874 7765 9478 9589 |
| 23 | 21 526 8828 8948 12761 15040 |
| 24 | 262 2861 4431 8144 14349 15919 |
| 25 | 514 1473 5196 6308 6639 15341 |
| 26 | 3200 6564 7236 8269 10308 11697 |
| 27 | 2612 5457 10178 10537 12460 15720 |
| 28 | 186 1303 3620 11467 14695 15158 |
| 29 | 1422 6300 6686 10571 13738 14320 |
| 30 | 7235 10922 11857 12434 13123 13441 |
| 31 | 2359 2626 5012 5868 6149 14584 |
| 32 | 3114 3810 11071 11498 12599 14861 |

Thus, Table 3 indicates indexes of rows having 1 in a $0^{th}$ column in an $i^{th}$ column group in the information word submatrix (210-2).

The information word submatrix (210-2) may be constituted with 33 column groups respectively including 360 columns, and positions of 1 in a $0^{th}$ column of each column group may be determined as Table 3. For example, in a $0^{th}$ column of a $0^{th}$ column group, 1 may be present at a $3224^{th}$ row, a $6160^{th}$ row, a $11356^{th}$ row, etc.

Further, positions of rows having 1 in a column of a column group may be determined by cyclic-shifting positions of rows having 1 in an adjacent column in the same column group by $Q_{ldpc2}$.

For example, in Table 3, $Q_{ldpc2}$ is 45, and indexes of rows having 1 in a $0^{th}$ column in a $0^{th}$ column group are 3224, 6160, 11356, etc. Thus, indexes of rows having 1 in a $1^{st}$ column of the $0^{th}$ column group may be 3281 (=3224+45), 6205(=6160+45), 11401(=11356+45), etc. Further, indexes of rows having 1 in a $2^{nd}$ column of a $0^{th}$ column group may be 3326 (=3281+45), 6250 (=6205+45), 11446 (=11401+45), etc.

Positions of rows having 1 in each column in a plurality of column groups may be determined in the information word submatrix (210-2), according to the above method.

The parity check matrix 200 may have a form in which the parity check matrix (200-1) and the parity check matrix (200-2) are concatenated with each other. In this case, following Equation 6 or 7 may describe one example method of defining the information word submatrix (210) of the parity check matrix (200) by concatenating the parity check matrix (200-1) and the parity check matrix (200-2).

$$R_{i,j}^{(k)} = \{R_{i,(j-1)}^{(k)} + Q_{ldpc1}\} \bmod(N_{ldpc1} - K_{ldpc}) \text{ (for } R_{i,0}^{(k)} < (N_{ldpc1} - K_{ldpc}))$$

$$R_{i,j}^{(k)} = (N_{ldpc1} - K_{ldpc}) + \{R_{i,(j-1)}^{(i)} - (N_{ldpc1} - K_{ldpc}) + Q_{ldpc2}\} \bmod(N_{ldpc2} - K_{ldpc}) \text{ (for } R_{i,0}^{(k)} \geq (N_{ldpc1} - K_{ldpc}))$$ (6)

where k=0, 1, 2, ..., $D_i$–1, i=0, 1, ..., $K_{ldpc}$/M–1, and j=0, 1, 2, ..., M31 1.

$$R_{i,j}^{(k)} = \{R_{i,0}^{(k)} + (j \times Q_{ldpc1})\} \bmod(N_{ldpc1} - K_{ldpc}) \text{ (for } R_{i,0}^{(k)} < (N_{ldpc1} - K_{ldpc}))$$

$$R_{i,j}^{(k)} = (N_{ldpc1} - K_{ldpc}) + \{R_{i,0}^{(k)} - (N_{ldpc1} - K_{ldpc}) + j \times Q_{ldpc2}\} \bmod(N_{ldpc2} - K_{ldpc}) \text{ (for } R_{i,0}^{(k)} \geq (N_{ldpc1} - K_{ldpc}))$$ (7)

According to the above method, positions of 1 in the information word submatrix (210) of the parity check matrix (200) may be represented as following Table 4 based on Tables 2 and 3.

Specifically, the information word submatrix (210) may be constituted with a plurality of column groups respectively including M number of columns, and positions of 1 in a $0^{th}$ column of each of the plurality of column groups may be represented as Table 4. In this case, $N_{ldpc}(=N_{ldpc1}+N_{ldpc2}-K_{ldpc})$ is 32400, $K_{ldpc}$ is 11800, the code rate is 11/30, and M is 360.

TABLE 4

| i | Indexes of rows having 1 On 0th column of ith column group |
|---|---|
| 0 | 108 297 703 742 1345 1443 1495 1628 1812 2341 2559 2669 2810 2877 3442 3690 3755 3904 4264 7544 10480 15676 16095 17842 |
| 1 | 180 211 477 788 824 1090 1272 1578 1685 1948 2050 2195 2233 2546 2757 2946 3147 3299 3544 8426 11058 13722 17105 19486 |
| 2 | 627 741 1135 1157 1226 1333 1378 1427 1454 1696 1757 1772 2099 2208 2592 3354 3580 4066 4242 5032 5554 14994 17211 18329 |
| 3 | 9 795 959 989 1006 1032 1135 1209 1382 1484 1703 1855 1985 2043 2629 2845 3136 3450 3742 7591 7738 11448 15021 19919 |
| 4 | 230 413 801 829 1108 1170 1291 1759 1793 1827 1976 2000 2423 2466 2917 3010 3600 3782 4143 5443 10754 14142 17813 20453 |
| 5 | 56 142 236 381 1050 1141 1372 1627 1985 2247 2340 3023 3434 3519 3957 4013 4142 4164 4279 7097 10152 12882 14468 17279 |
| 6 | 298 1211 2548 3643 4875 7960 11672 16044 16878 |
| 7 | 73 1070 1614 1748 6216 7768 13481 15225 18512 |
| 8 | 1439 2141 3614 11710 14771 15515 16418 18167 |
| 9 | 284 1564 2629 8508 8623 9598 15713 18675 |
| 10 | 607 660 855 9991 10233 11029 18440 19224 |
| 11 | 1195 2037 2753 4972 6032 6590 6701 7448 |
| 12 | 49 1198 2562 10955 13383 14136 16605 19071 |
| 13 | 296 1145 3540 4468 16304 16899 19470 20306 |
| 14 | 1516 2315 2382 6031 6496 10185 12697 19527 |
| 15 | 154 722 4016 5940 7936 13893 14650 18952 |
| 16 | 759 2375 3825 8334 9484 10722 14742 14856 |
| 17 | 162 194 1749 7475 10487 13654 17265 19858 |
| 18 | 2335 2422 2632 5410 6559 12929 13570 14339 16186 |
| 19 | 6 1172 2583 5282 9339 11317 12459 15836 17283 |
| 20 | 726 1325 1428 8680 9393 13667 14092 15793 20322 |

TABLE 4-continued

| i | Indexes of rows having 1 On 0th column of ith column group |
|---|---|
| 21 | 985 2708 2769 4760 5960 13632 13942 17734 18171 |
| 22 | 255 2801 3181 4325 6797 7194 12085 13798 13909 |
| 23 | 2979 3720 4090 4341 4846 13148 13268 17081 19360 |
| 24 | 208 1428 4094 4582 7181 8751 12464 18669 20239 |
| 25 | 199 3743 3757 4834 5793 9516 10628 10959 19661 |
| 26 | 1229 2059 4282 7520 10884 11556 12589 14628 16017 |
| 27 | 458 1100 1387 6932 9777 14498 14857 16780 20040 |
| 28 | 1199 2481 3284 4506 5623 7940 15787 19015 19478 |
| 29 | 1161 1467 4060 5742 10620 11006 14891 18058 18640 |
| 30 | 959 3014 4144 11555 15242 16177 16754 17443 17761 |
| 31 | 2666 3960 4125 6679 6946 9332 10188 10469 18904 |
| 32 | 2809 3834 4318 7434 8130 15391 15818 16919 19181 |

Thus, Table 4 indicates indexes of rows having 1 in a $0^{th}$ column of an $i^{th}$ column group in the information word submatrix (210).

The information word submatrix (210) may be constituted with 33 column groups respectively including 360 columns, and positions of 1 in a $0^{th}$ column of each column group may be represented as Table 4 described above. For example, in a $0^{th}$ column of a $0^{th}$ column group, 1 may be present in a $108^{th}$ row, a $297^{th}$ row, a $703^{rd}$ row, . . . , a $7544^{th}$ row, a $10480^{th}$ row, a $15676^{th}$ row, a $16095^{th}$ row, and a $17842^{nd}$ row.

Further, positions of rows having 1 in a column of a column group may be determined by cyclic-shifting positions of rows having 1 in an adjacent column in the column group by $Q_{ldpc1}$ and $Q_{ldpc2}$.

Figure 4:
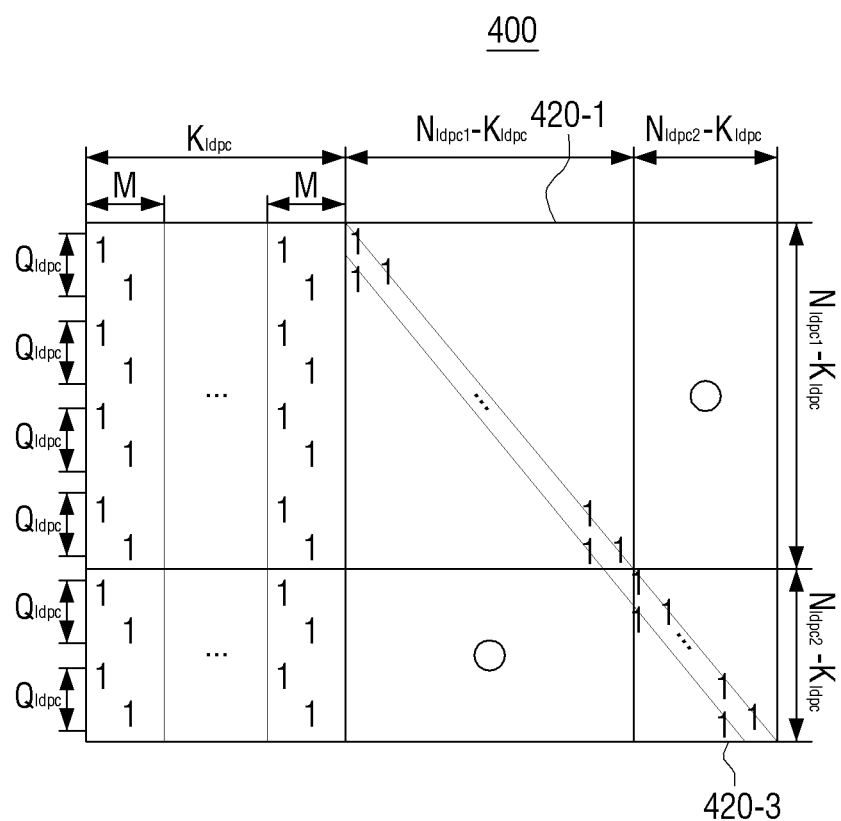

Specifically, referring to FIG. 4, $(N_{ldpc1}-K_{ldpc})=4320$, $(N_{ldpc2}-K_{ldpc})=16200$, $Q_{ldpc1}=12$, and $Q_{ldpc2}=45$. Indexes of rows having 1 in a $0^{th}$ column of a $0^{th}$ column group are 108, 297, 703, . . . , 7544, 10480, 15676, 16095 and 17842.

In this case, indexes of rows having 1 in a $1^{st}$ column of the $0^{th}$ column group may be described below by dividing a case in which an index of each row is 108, 297, 703, . . . , 3904 or 4264 which is less than $(N_{ldpc1}-K_{ldpc})=4320$ and a case in which an index of each row is 7544, 10480, 15676, 16095 or 17842 which is greater than or equal to $(N_{ldpc1}-K_{ldpc})=4320$.

Thus, when an index of each row is 108, 297, 703, . . . , 3904, or 4264 which is less than $(N_{ldpc1}-K_{ldpc})=4320$, indexes of rows having 1 in a $1^{st}$ column of the $0^{th}$ column group may be 120 (=(108+12) mod 4320), 309 (=(297+12) mod 4320), 715 (=(703+12) mod 4320), . . . , 3916 (=(3904+12) mod 4320), and 4276 (=(4264+12) mod 4320). Further, indexes of rows having 1 in a $2^{nd}$ column of the $0^{th}$ column group may be 132 (=(120+12) mod 4320), 321 (=(309+12) mod 4320), 727 (=(715+12) mod 4320), . . . , 3928 (=(3916+12) mod 4320), and 4288 (=(4276+12) mod 4320).

When an index of each row is 7544, 10480, 15676, 16095, or 17842 which is greater than or equal to $(N_{ldpc1}-K_{ldpc})=4320$, indexes of rows having 1 in a $1^{st}$ column of the $0^{th}$ column group may be 7589 (=4320+(7544-4320+45) mod 16200), 10525 (=4320+(10480-4320+45) mod 16200), 15721 (=4320+(15676-4320+45) mod 16200), 16140 (=4320+(16095-4320+45) mod 16200), and 1687 (=4320+(17842-4320+45) mod 16200). Further, indexes of rows having 1 in a $2^{nd}$ column of the $0^{th}$ column group may be 7634 (=4320+(7589-4320+45) mod 16200), 10570 (=4320+(10525-4320+45) mod 16200), 15766 (=4320+(15721-4320+45) mod 16200), 16185 (=4320+(16040-4320+45) mod 16200), and 1732 (=4320+(1687-4320+45) mod 16200).

Positions of rows having 1 in each column in a plurality of column groups in the information word submatrix (210) may be determined according to the above method.

Referring to Tables 1 to 3, even when an order of the indexes changes in an $i^{th}$ column group, the same parity check matrix may be obtained.

For example, referring to Table 2, the sequence corresponding to a $0^{th}$ column of a $0^{th}$ column group lists 108, 297, 703, . . . , 15676, 16095, and 17842 as row indexes. Even when an order of the indexes changes within the sequence such as 17842, 16095, 15676, . . . , 703, 297, and 108, the same parity check matrix may be obtained.

Further, even when an order of sequences corresponding to the respective column groups change in Tables 2 to 4, algebraic characteristics such as cycle characteristics, a degree distribution and a minimum distance may not change on graphs of the LDPC code. Therefore, the changes in the order of the sequences described in Tables 2 to 4 may be another example of the results that can be obtained through an LDPC code establishing method suggested by the inventive concept.

For example, referring to Table 2, when sequence corresponding to a $0^{th}$ column of a $0^{th}$ column group, i.e., 108, 297, 703, . . . , 15676, 16095 and 17842, and another sequence corresponding to a $0^{th}$ column of a $12^{th}$ column group, i.e., 49, 1198, 2562, 10955, 13383, 14136, 16605 and 19071, are respectively changed such that the $0^{th}$ column of the $0^{th}$ column group has 49, 1198, 2562, 10955, 13383, 14136, 16605 and 19071 as its row indexes, and the $0^{th}$ column of the $12^{th}$ column group has 108, 297, 703, . . . , 15676, 16095 and 17842 as its row indexes, there is no change in the cycle characteristics, the degree distribution and the minimum distance on graphs of the LDPC code. In other words, changing the order of sequences corresponding to the respectively column groups is the same as changing an arrangement order of the column groups within a parity check matrix. Thus, the algebraic characteristics may not change.

Further, referring to Tables 2 to 4, adding a multiple of $Q_{ldpc}$ uniformly to all of the row indexes in a given column group may not change the algebraic characteristics on the graphs of the LDPC codes. Thus, adding the multiple of $Q_{ldpc}$ uniformly may be one example of the results that can be obtained through the LDPC code establishing method suggested by the inventive concept.

For example, referring to Table 2, an uniform multiple of 12 $(=Q_{ldpc1}=(N_{ldpc1}-K_{ldpc})/M)$ may be added to the sequence corresponding to a $0^{th}$ column of a $12^{th}$ column group, i.e., 49, 1198, 2562, 10955, 13383, 14136, 16605 and 19071. More specifically, the adding result may be 85 (=49+12×3), 1234 (=1198+12×3), 2598 (=2562+12×3), 10991 (=10955+12×3), 13419 (=13383+12×3), 14172 (=14136+12×3), 16641 (=16605+12×3) and 19107 (=19071+12×3), or may be 109 (=49+12×5), 1258 (=1198+12×5), 2622 (=2562+12×5), 11015 (=10955+12×5), 13443 (=13383+12×5), 14196 (=14136+12×5), 16665 (=16605+12×5), and 19131 (=19071+12×5). However, the algebraic characteristics such as the cycle features, the degree distribution and the minimum distance on graphs of the LDPC codes may not change. In other words, because the sequence obtained by adding a multiple of $Q_{ldpc}$ to a random sequence may be the same as rearranging an order of columns in a column group, the algebraic characteristics may not change.

Here, when a value obtained by adding a multiple of $Q_{ldpc}$ to a sequence is equal to, or greater than $(N_{ldpc}-K_{ldpc})$, the value may be modified into a value generated by applying a modulus operation with respect to $(N_{ldpc}-K_{ldpc})$, and used.

Further, the sequences of Tables 2 to 4 may be described based on the structures of the parity check matrix in FIGS. 2 and 3. However, when applying a row permutation to rearrange a row order or a column permutation to rearrange a column order to the parity check matrix, the parity check matrix may be expressed with a different form from the structure of FIG. 3. However, these modifications such as row permutation and column permutation may not change the algebraic characteristics of an LDPC code, and thus, the modified parity check matrix may be considered the same parity check matrix.

Thus, one parity check matrix may be modified into the parity check matrix having the structure of FIGS. 2 and 3 through row permutation and column permutation. When the modified parity check matrix has matching sequences described in Tables 2 to 4, the two parity check matrices may be considered to be equivalent algebraically.

Both the parity submatrix (220-1) of the parity check matrix (200-1) and the parity submatrix (220-3) of the parity check matrix (200-2) may have a dual diagonal structure.

Thus, in the parity submatrix (220-1), the degree of all columns other than the last column (i.e., $(N_{ldpc1}-1)^{th}$ column) may be 2 and the degree of the last column may be 1. Likewise, among the columns included in the parity submatrix (220-3), the degree of all columns other than the last column (i.e., $(N_{ldpc2}-1)^{th}$ column) may be 2 and the degree of the last column may be 1.

Therefore, the parity submatrix (220) of the parity check matrix (200) generated from the concatenation of the parity check matrix (200-1) and the parity check matrix (200-2) may be determined as follows.

Specifically, the parity check matrix (200) may include the four parity submatrices (220-1, 220-2, 220-3, 220-4).

Among the four parity submatrices (220-1, 220-2, 220-3, 220-4), the two parity submatrices (220-1, 220-3) which are not concatenated with each other may have the dual diagonal structure, and the other two parity submatrices (220-2, 220-4) may be zero matrices.

Therefore, in the parity submatrix (220), the degrees of all columns other than an $(N_{ldpc1}-1)^{th}$ column and an $(N_{ldpc1}+N_{ldpc}-K_{ldpc}-1)^{th}$ column may be 2, and the degrees of the $(N_{ldpc}-1)^{th}$ column and the $(N_{ldpc1}+N_{ldpc2}-K_{ldpc}-1)^{th}$ column may be 1.

In this case, the first parity bits may be generated based on one (220-1) of the parity submatrices (220-1, 220-3) having the dual diagonal structure, and the second parity bits may be generated based on the other (220-3) of the parity submatrices (220-1, 220-3) having the dual diagonal structure.

Specifically, because the two parity check matrices (200-1, 200-2) are concatenated with each other in the parity check matrix (200), parity bits generated based on the parity check matrix (200) may take a structure in which parity bits generated respectively based on the two parity check matrices (200-1, 200-2) are concatenated with each other.

Therefore, the first parity bits generated based on the parity submatrix (220-1) of the parity check matrix (200) may be considered to be based on the parity submatrix (220-1) of the parity check matrix (200-1), and the second parity bits generated based on the parity submatrix (220-3) of the parity check matrix (200) may be considered to be based on the parity submatrix (220-3) of the parity check matrix (200-2).

The following will describe a parity check matrix (300) illustrated in FIG. 3.

Referring to FIG. 3, the parity check matrix (300) may be generated by concatenating a parity check matrix (300-1) and a parity check matrix (300-2).

An information word submatrix (310-1) of the parity check matrix (300-1) may have a same structure as the information word submatrix (210-1) of the parity check matrix (200-1), and an information word submatrix (310-2) of the parity check matrix (300-2) may have a same structure as the information word submatrix (310-1) of the parity check matrix (300-1).

Therefore, positions of 1 in the information word submatrix (310-1) may be determined referring to above Table 2, positions of 1 in the information word submatrix (310-2) may be determined referring to above Table 3, and positions of 1 in the information word submatrix (310) may be determined referring to above Table 4.

Referring to FIG. 3, the parity submatrix (320-1) of the parity check matrix (300-1) may have a dual diagonal structure, and the parity submatrix (320-3) of the parity check matrix (300-2) may have an identity matrix (or unit matrix) structure.

Thus, in the parity submatrix (320-1), the degrees of all columns other than the last column (i.e., $(N_{ldpc1}-1)^{th}$ column) may be 2 and the degree of the last column may be 1. The degrees of all columns included in the parity submatrix (320-3) may be 1.

Therefore, the parity submatrix (320) may be determined as follows in the parity check matrix (300) generated by concatenating the parity check matrix (300-1) and the parity check matrix (300-2) with each other.

Specifically, the parity check matrix (300) may include the four parity submatrices (320-1, 320-2, 320-3, 320-4).

Among the four parity submatrices (320-1, 320-2, 320-3, 320-4), one (320-1) may have the dual diagonal matrix structure, and another (320-3) may have the identity matrix structure. Further, the other two parity submatrices (320-2, 320-4) may be zero matrices.

Therefore, the degrees of the columns from $(N_{ldpc1}-1)^{th}$ to $(N_{ldpc1}+N_{ldpc2}-K_{ldpc}-1)^{th}$ may be 1 in the parity submatrix (320), and the degrees of the other columns may be 2.

In this case, the first parity bits may be generated based on the parity submatrix (320-1) having the dual diagonal structure, and the second parity bits may be generated based on the parity submatrix (320-3) having the identity matrix structure.

Specifically, because the parity check matrix (300) may have a form in which the two parity check matrices (300-1, 300-2) are concatenated with each other, the parity bits generated based on the parity check matrix (300) may have a structure in which parity bits generated respectively based on the two parity check matrices (300-1, 300-2) are concatenated with each other.

Therefore, the first parity bits generated based on the parity submatrix (320-1) of the parity check matrix (300) may be considered to be based on the parity check matrix (320-1) of the parity check matrix (300-1). The second parity bits generated based on the parity submatrix (320-3) of the parity check matrix (300) may be considered to be based on the parity submatrix (320-3) of the parity check matrix (300-2).

The above embodiments describes that $M=(N_{ldpc1}-K_{ldpc})/Q_{ldpc1}=(N_{ldpc2}-K_{ldpc})/Q_{ldpc2}$.

Specifically, when a parameter value for cyclic-shifting columns respectively in a plurality of column groups constituting the information word submatrix (210-1), i.e., $M_1$ is a common divisor of $N_{ldpc1}$ and $K_{ldpc}$, and meets a relationship of $M_1=(N_{ldpc1}-K_{ldpc})/Q_{ldpc1}$, and when a parameter value for cyclic-shifting columns respectively in a plurality of column groups constituting the information word submatrix (210-2), i.e., $M_2$ is a common divisor of $N_{ldpc2}$ and $K_{ldpc}$, and meets a relationship of $M_2=(N_{ldpc2}-K_{ldpc})/Q_{ldpc2}$, a following relationship is established: $M=M_1=M_2=(N_{ldpc1}-K_{ldpc})/Q_{ldpc1}=(N_{ldpc2}-K_{ldpc})/Q_{ldpc2}$.

Thus, M may be determined from among common divisors of $N_{ldpc1}$ and $K_{ldpc}$ and common divisors of $N_{ldpc2}$ and $K_{ldpc}$ to satisfy the relationship of $(N_{ldpc1}-K_{ldpc})/Q_{ldpc1}=(N_{ldpc2}-K_{ldpc})/Q_{ldpc2}$. In other words, M may be determined based on a value satisfying $(N_{ldpc1}-K_{ldpc})/Q_{ldpc1}=(N_{ldpc2}-K_{ldpc})/Q_{ldpc2}$ from among common divisors of $N_{ldpc1}$, $N_{ldpc2}$ and $K_{ldpc}$.

Referring to FIG. 2, the parity check matrix (200) may be constituted with the two information word submatrices (210-1, 210-2) and the four parity check matrices (220-1, 220-2, 220-3, 220-4). Among the four parity check matrices (220-1, 220-2, 220-3, 220-4), the two parity check matrices (220-1, 220-3) which are not connected with each other may have the dual diagonal structure, and the other two parity check matrices (220-2, 220-4) may be zero matrices.

Further, referring to FIG. 3, the parity check matrix (300) may be constituted with the two information word submatrices (310-1, 310-2) and the four parity check matrices (320-1, 320-2, 320-3, 320-4). Among the four parity check matrices (320-1, 320-2, 320-3, 320-4), one (320-1) of the two parity check matrices which are not concatenated with each other may have the dual diagonal structure, the other (320-3) may have the identity matrix structure, and the remaining two parity check matrices (320-2, 320-4) may be zero matrices.

Thereby, $Q_{ldpc1}$ is a cyclic shift parameter value in one (210-1 or 310-1) of the two information word submatrices (210-1, 210-2 or 310-1, 310-2), $N_{ldpc1}-K_{ldpc}$ is a number of rows constituting the information word submatrix (210-1 or 310-1) (or, a number of columns and a number of rows constituting one (220-1 or 320-1) among the parity submatrices which are not zero matrices), $Q_{ldpc2}$ is a cyclic shift parameter value in the other (210-2 or 310-2) among the two information word submatrices (210-1, 210-2 or 310-1, 310-2), and $N_{ldpc2}-K_{ldpc}$ is a number of rows constituting the information word submatrix (210-2 or 310-2) (or, a number of columns and a number of rows constituting the other (320-3) in the parity submatrices which are not zero matrices).

However, the above is provided for convenient explanation and merely one of exemplary embodiments. $M_1$ and $M_2$ may be also determined to meet a relationship of $M_1=(N_{ldpc1}-K_{ldpc})/Q_{ldpc1} \neq (N_{ldpc2}-K_{ldpc})/Q_{ldpc2}=M_2$.

The following will explain a specific method generating parity bits by using a parity check matrix.

First, explained will be a method generating parity bits by using the parity check matrix (200) having the structure of FIG. 2.

As described above, an LDPC encoding process may generate an LDPC codeword, C which satisfies $H \cdot C^T=0$ with respect to the parity check matrix, H (200). Therefore, the encoder 110 may generate an LDPC codeword constituted with information word bits and parity bits by performing LDPC encoding so as to meet $H \cdot C^T=0$. Here, the parity bits may include first parity bits and second parity bits.

The parity bits generated based on the parity check matrix (200) may have a form in which the first parity bits generated based on the parity check matrix (200-1) and the second parity bits generated based on the parity check matrix (200-2) are concatenated with each other.

Thus, the following will first explain a method generating the first parity bits (referred to as parity bits below) based on the parity check matrix (200-1). However, there may be various encoding methods regarding the parity check matrix, and the following is merely one of exemplary embodiments.

Step 1) Initialize the parity bits with '0.'

Thus, $p_0=p_1=p_2=\ldots=p_{N_{ldpc1}-K_{ldpc}-1}=0$

Step 2) Accumulate a $0^{th}$ information word bit $i_0$ to a parity bits having addresses as the indexes included in the first row (i.e., row at i=0) of Table 2. The accumulation may be represented by following Equation 8.

$$\begin{aligned}
p_{108} &= p_{108} \oplus i_0 & p_{2810} &= p_{2810} \oplus i_0 \\
p_{297} &= p_{297} \oplus i_0 & p_{2877} &= p_{2877} \oplus i_0 \\
p_{703} &= p_{703} \oplus i_0 & p_{3442} &= p_{3442} \oplus i_0 \\
p_{742} &= p_{742} \oplus i_0 & p_{3690} &= p_{3690} \oplus i_0 \\
p_{1345} &= p_{1345} \oplus i_0 & p_{3755} &= p_{3755} \oplus i_0 \\
p_{1443} &= p_{1443} \oplus i_0 & p_{3904} &= p_{3904} \oplus i_0 \\
p_{1495} &= p_{1495} \oplus i_0 & p_{4264} &= p_{4264} \oplus i_0 \\
p_{1628} &= p_{1628} \oplus i_0 & p_{7544} &= p_{7544} \oplus i_0 \\
p_{1812} &= p_{1812} \oplus i_0 & p_{10480} &= p_{10480} \oplus i_0 \\
p_{2341} &= p_{2341} \oplus i_0 & p_{15676} &= p_{15676} \oplus i_0 \\
p_{2559} &= p_{2559} \oplus i_0 & p_{16095} &= p_{16095} \oplus i_0 \\
p_{2669} &= p_{2669} \oplus i_0 & p_{17842} &= p_{17842} \oplus i_0
\end{aligned} \quad \text{[Equation 8]}$$

Here, $i_0$ is the $0^{th}$ information word bit, and $p_i$ is an $i^{th}$ parity bit. Further, $\otimes$ indicates a binary calculation; according to the binary calculation, $1 \oplus 1$ is 0, $1 \oplus 0$ is 1, $0 \oplus 1$ is 1, and $0 \oplus 0$ is 0.

Step 3) Accumulate the other 359 information word bits $i_m$ (m=1, 2, ... 359) to the parity bits. Here, the other 359 information word bits may be information word bits belonging to a same column group to $i_0$. At this process, the addresses of the parity bits may be determined based on following Equation 9.

$$\{\chi+(m \bmod 360) \times Q_{ldpc1}\} \bmod (N_{ldpc1}-K_{ldpc}) \quad (9)$$

Here, $\chi$ is an address of parity bits corresponding to the information word bits, $i_0$.

For example, when calculating addresses of the parity bits in which an information word bit $i_1$ is accumulated based on $p_{108}$ in which the information word bit $i_0$ is previously accumulated, addresses of the parity bits in which $i_1$ is accumulated may be $p_{120}$ based on $p_{108}$ in which $i_0$ is previously accumulated because {108+(1 mod 360)× 12}mod (16200−11880)=120.

As a result, accumulate respectively the information word bits, $i_m$ (m=1, 2, . . . , 359) to the parity bits having addresses of the calculated parity bits based on Equation 9 as indexes. For example, following Equation 10 may be calculated with respect to a 1$^{st}$ information word bit, $i_1$.

$$p_{120} = p_{120} \oplus i_1 \quad p_{2822} = p_{2822} \oplus i_1$$
$$p_{309} = p_{309} \oplus i_1 \quad p_{2889} = p_{2889} \oplus i_1$$
$$p_{715} = p_{715} \oplus i_1 \quad p_{3454} = p_{3454} \oplus i_1$$
$$p_{754} = p_{754} \oplus i_1 \quad p_{3702} = p_{3702} \oplus i_1$$
$$p_{1357} = p_{1357} \oplus i_1 \quad p_{3767} = p_{3767} \oplus i_1$$
$$p_{1455} = p_{1455} \oplus i_1 \quad p_{3916} = p_{3916} \oplus i_1$$
$$p_{1507} = p_{1507} \oplus i_1 \quad p_{4276} = p_{4276} \oplus i_1$$
$$p_{1640} = p_{1640} \oplus i_1 \quad p_{7556} = p_{7556} \oplus i_1$$
$$p_{1824} = p_{1824} \oplus i_1 \quad p_{10492} = p_{10492} \oplus i_1$$
$$p_{2353} = p_{2353} \oplus i_1 \quad p_{15688} = p_{15688} \oplus i_1$$
$$p_{2571} = p_{2571} \oplus i_1 \quad p_{16107} = p_{16107} \oplus i_1$$
$$p_{2681} = p_{2681} \oplus i_1 \quad p_{17854} = p_{17854} \oplus i_1$$

[Formula 10]

Herein, $i_1$ is the 1$^{st}$ information word bit, and $p_i$ is an i$^{th}$ parity bit. Further, ⊕ indicates the binary calculation. According to the binary calculation, 1⊕1 is 0, 1⊕0 is 1, 0⊕1 is 1, and 0⊕0 is 0.

Step 4) Accumulate a 359$^{th}$ information word bit, $i_{359}$ to the parity bits having addresses as the indexes included in the second row (i.e., row at i=1) of Table 2.

Step 5) Accumulate the other 359 information word bits belonging to a same column group to the information word bit $i_{359}$ to the parity bits. Here, addresses of the parity bits may be determined based on Equation 9. However, χ may be an address of a parity bit corresponding to the information word bit $i_{359}$.

Step 6) Repeat the above described steps 4 and 5 regarding all column groups of Table 2.

Step 7) As a result, the parity bit $p_i$ may be calculated based on following

Equation 11 Here, i may be initialized to be 1.

$$p_i = p_i \oplus p_{i-1}(i=1,2, \ldots, N_{ldpc1}-K_{ldpc}-1) \quad (11)$$

As a result, the encoder 110 may generate the first parity bits, $p_i$ (i=0, 1, 2, . . . , $N_{ldpc1}-K_{ldpc}-1$) by using above Equation 11.

When considering that the parity submatrix (220-1) of the parity check matrix (200-1) and the parity submatrix (220-3) of the parity check matrix (200-2) may have a same structure (i.e., a dual diagonal structure), the encoder 110 may generate the second parity bits in the same method for the first parity bits.

However, the second parity bits may include parity bits from $(N_{ldpc1}-K_{ldpc})^{th}$ to $(N_{ldpc}-K_{ldpc}-1)^{th}$ among the whole parity bits. Thus, the encoder 110 may generate the second parity bits $p_i$ by using following Equation 12.

$$p_i = p_i \oplus p_{i-1}(i=N_{ldpc1}-K_{ldpc}, N_{ldpc1}-K_{ldpc}+1, \ldots, N_{ldpc}-K_{ldpc}-1) \quad (12)$$

According to Equations 11 and 12, $N_{ldpc}$ is the length of an LDPC codeword, $K_{ldpc}$ is the length of information word bits, $N_{ldpc1}-K_{ldpc}$ is the length of the first parity bits, and $N_{ldpc2}-K_{ldpc}$ is the length of the second parity bits.

The encoder 110 may generate LDPC codewords C satisfying $H \cdot C^T=0$ regarding the parity check matrix H (300) illustrated in FIG. 3. Herein, LDPC codewords may be constituted with the information word bits and the parity bits, and the parity bits may include the first parity bits and the second parity bits.

In this case, the parity bits generated based on the parity check matrix (300) may have a form in which the first parity bits generated based on the parity check matrix (300-1) and the second parity bits generated based on the parity check matrix (300-2) are concatenated with each other.

Because the parity submatrix (320-1) of the parity check matrix (300-1) may have the dual diagonal structure, the method explained by referring to FIG. 2 may be uniformly applied. Thus, the encoder 110 may generate the first parity bits $p_i$ based on a following mathematical formula 13.

$$p_i = p_i \oplus p_{i-1}(i=1, 2, \ldots, N_{ldpc1}-K_{ldpc}-1) \quad (13)$$

Because the parity submatrix (320-3) of the parity check matrix (300-2) may have the identity matrix structure, the encoder 110 may generate the second parity bits $p_i$ by using a following mathematical formula 14.

$$p_i = p_i(i=N_{ldpc1}-K_{ldpc}, N_{ldpc1}-K_{ldpc}+1, \ldots, N_{ldpc}-K_{ldpc}-1) \quad (14)$$

According to Equations 13 and 14, $N_{ldpc}$ is the length of the LDPC codeword, $K_{ldpc}$ is the length of the information word bits, $N_{ldpc1}-K_{ldpc}$ is the length of the first parity bits, and $N_{ldpc2}-K_{ldpc}$ is length of the second parity bits.

Thus, the parity check matrix (200, 300) may include the matrix (200-2, 300-2) to generate the parity check matrix supporting the IR method, i.e., additional parity bits. The encoder 110 may generate the encoded data to be transmitted originally in the IR method (i.e., the information word bits and the first parity bits) and the additional parity (i.e., the second parity bits) through LDPC encoding.

When the additional parity is generated according to the above method, transmission and reception of data may be performed according to the IR method. Thus, the decoding performance can be enhanced in a receiver of the data.

Furthermore, referring to FIGS. 2 and 3, a quasi-cyclic structure may be obtained and kept in the information word submatrix (210-2, 310-2) to generate the additional parity as well as in the matrix to generate the encoded data initially transmitted. Thus, the receiver may decode the received data without having additional logics.

Specifically, according to the DVB-T2 standard, the information word submatrix may perform LDPC encoding and decoding by using the parity check matrix having the quasi-cyclic structure. Therefore, even when the additional parity is generated by using the parity check matrix (200, 300) according to the present exemplary embodiment, the receiver defined in the DVB-T2 may perform LDPC decoding by using the parity check matrix (200, 300) without having additional logics.

Further, the parity submatrix (320-3) to generate the additional parity may be constituted to be an identity matrix. When the parity check matrix (300) having the structure of FIG. 3 is used in performing LDPC encoding, the additional parity may be generated by a simple calculation using Equation 14. Therefore, LDPC encoding may be performed using a simple calculation, and time and cost in LDPC encoding can be reduced.

Furthermore, since the parity submatrix (320-3) is an identity matrix, when some of the parity bits generated additionally are punctured, the receiver may remove a submatrix corresponding to the punctured parity bits from the parity submatrix (320-3), and perform LDPC decoding. Thus, time and cost in LDPC decoding can be reduced.

Information about the parity check matrix described above may be previously stored in the transmitter 100.

Further, the encoder 110 may perform Bose, Chaudhuri, Hocquenghem (BCH) encoding as well as LDPC encoding. For the above, the encoder 110 may further include a BCH encoder (not illustrated) for the BCH encoding. Thus, the encoder 110 may generate a BCH codeword by performing the BCH encoding on input bits, and generate an LDPC codeword including the information word bits, the first parity bits and the second parity bits by performing LDPC encoding on the BCH codeword as information word bits.

Further, the encoder 110 may puncture at least certain bits of the first parity bits and the second parity bits. The puncturing indicates that some of the parity bits are not transmitted, and the punctured parity bits may not be transmitted to the receiver. Therefore, the encoder 110 may puncture certain bits of the parity bits from LDPC codeword and output to the interleaver 120.

The interleaver 120 may interleave the LDPC codeword. The interleaver 120 may include a first interleaver 121 to interleave the information word bits and the first parity bits and a second interleaver 123 to interleave the second parity bits. Thus, the encoder 110 may output the information word bits generated and the first parity bits by the LDPC encoding to the first interleaver 121 and the second parity bits to the second interleaver 123.

The first interleaver 121 and the second interleaver 123 may be configured to as bit interleavers, and interleave the LDPC codeword on a bit basis. In this case, the bit interleaver may include Ne number of columns, and each column may be constituted with $N_r$ number of rows.

Therefore, the first interleaver 121 and the second interleaver 123 may write the bits output from the encoder 110 from the first column to the $N_c^{th}$ column in a column direction, and read a plurality of columns, in which the bits are written, from the first row to the $N_r^{th}$ row in a row direction. Therefore, the written bits on a same row per column may be consecutively output, and an order of the bits may be rearranged compared to an order of the bits before the interleaving For example, the first interleaver 121 may output v=($v_0$, $v_1$, $v_2$, . . . ) by receiving the input of the information word bits and the first parity bits ($i_0$, $i_1$, $i_2$, . . . , $i_{K_{ldpc}-1}$, $p_0$, $p_1$, $p_2$, . . . , $p_{N_{ldpc1}-K_{ldpc}-1}$) and performing the interleaving. The second interleaver 123 may output u=(u0, u1, u2, . . . ) by receiving the input of the second parity bits ($p_{N_{ldpc1}-K_{ldpc}}$, $p_{N_{ldpc1}-K_{ldpc}-1}$, . . . , $p_{N_{ldpc}-K_{ldpc}-1}$) and performing the interleaving.

The constellation mapper 130 may map the interleaved LDPC codeword on constellation points.

Herein, the constellation mapper 130 may include a first constellation mapper 131 to map an output of the first interleaver 121 on constellation points, and a second constellation mapper 133 to map an output of the second interleaver 123 on constellation points. Thus, the first constellation mapper 131 may map the information word bits and the first parity bits which are interleaved by the first interleaver 121 on constellation points, and the second constellation mapper 133 may map the second parity bits interleaved by the second interleaver 123 on constellation points.

The first constellation mapper 131 and the second constellation mapper 133 may perform same functions even though they receive different input values. The following will explain operations of the first constellation mapper 131, for example.

The first constellation mapper 131 may generate cells by de-multiplexing bits output from the first interleaver 121, and modulate the generated cells.

The first constellation mapper 131 may perform a bit-to-cell conversion with respect to the bits output from the first interleaver 121, and de-multiplex the bits output from the first interleaver 121 into cells constituted with a certain number of bits.

For example, the first constellation mapper 131 may output the bits output from the first interleaver 121 consecutively to one among a plurality of sub streams, and convert the bits output from the first interleaver 121 into cells. In this case, a cell may be constituted with bits having a same indexe in each among the plurality of the sub streams.

Here, a number of the sub streams may be the same as a number of the bits constituting a cell. For example, when modulation methods are respectively BPSK, QPSK, 16-QAM, and 256-QAM, a number of the sub streams may be respectively 1, 2, 4, 6, and 8.

The first constellation mapper 131 may modulate the cells. The first constellation mapper 131 may modulate the cells by mapping the cells on constellation points using various modulation methods such as BPSK, QPSK, 16-QAM, 64-QAM, and 256-QAM. Here, when the modulation methods are respectively BPSK, QPSK, 16-QAM, 64-QAM, and 256-QAM, a number of bits constituting a modified cell (i.e., a modulation symbol) may be respectively 1, 2, 4, 6, and 8.

The transmitter 100 may transmit the modulation symbols to the receiver (not illustrated). For example, the transmitter 100 may map the modulation symbols on OFDM frames by using an OFDM method, and transmit through the allocated channels to the receiver (not illustrated). Thus, the transmitter 100 may transmit the data to the receiver (not illustrated) using the IR method.

Referring to FIGS. 2 and 3, the size of the parity submatrix (220-3, 320-3) to generate the additional parity may be greater than or equal to the size of the parity submatrix (220-1, 320-1) to generate the originally encoded data. Thus, the additional parity bits may be constituted with the same or greater number of the bits than that of the parity bits included in the originally encoded data.

Figure 5:
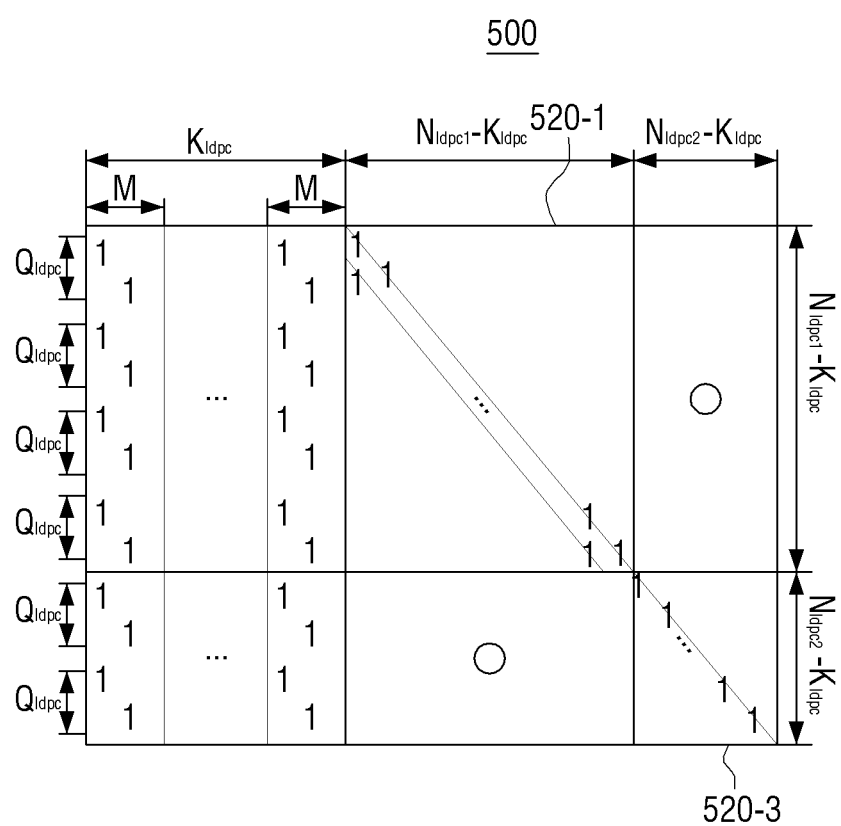

However, this is merely one of exemplary embodiments. Referring to FIGS. 4 and 5, the size of a parity submatrix (420-3, 520-3) to generate the additional parity may be smaller than the size of a parity submatrix (420-1, 520-1) to generate the originally encoded data. Thus, $N_{ldpc2}-K_{ldpc}$ of a parity check matrix (400, 500) in FIGS. 4 and 5 may be smaller than $N_{ldpc2}-K_{ldpc}$ of the parity check matrix (200, 300) in FIGS. 2 and 3.

In this case, the additional parity may be constituted with a smaller number of bits than that of the parity bits included in the originally encoded data. Thus, a number of bits in the second parity bits may be smaller than that of bits in the first parity bits.

When a number of the bits in the second parity bits is smaller than that of the bits in the first parity bits, the transmitter 100 may transmit the bits included in the originally encoded data when transmitting the additional parity. Thus, the transmitter 100 may generate the modulation symbols including the second parity bits in addition to some of the information word bits and the first parity bits, and transmit to the receiver 600 of FIG. 8. The specific will be described below by referring to FIG. 7.

Figure 6:
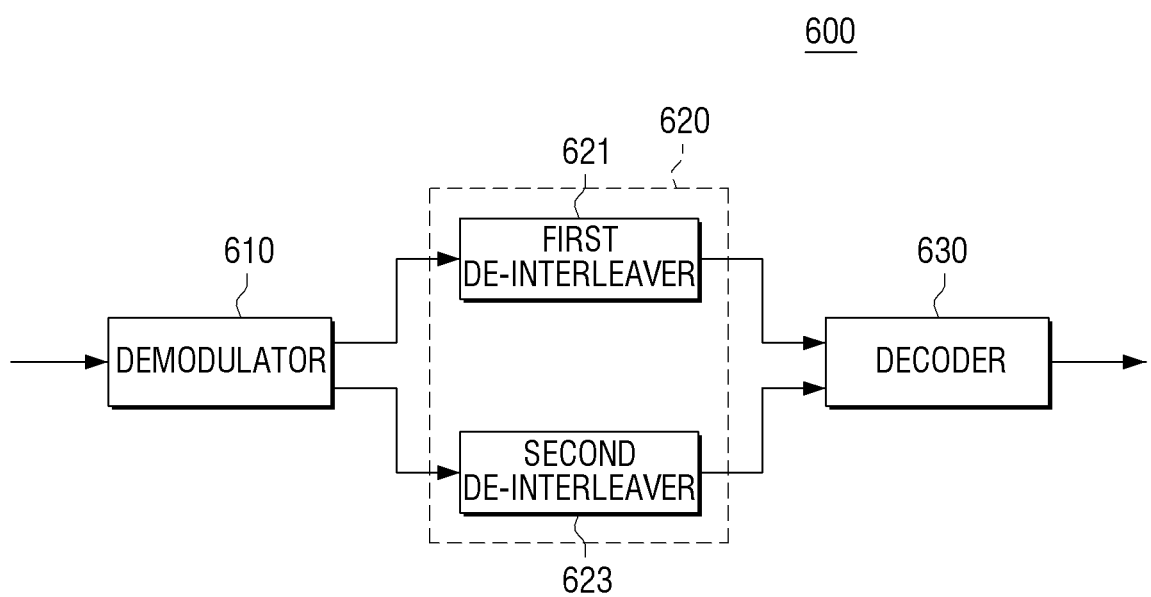
FIGS. 6 and 8 are block diagrams related to a receiver according to an exemplary embodiment.

FIG. 6 is a block diagram of a receiver, according to an exemplary embodiment. Referring to FIG. 6, the receiver 600 may include a demodulator 610, a de-interleaver 620, and the decoder 630.

The demodulator 610 (or constellation demapper) may receive and demodulate a signal transmitted from the transmitter 100. Specifically, the demodulator 610 may demodulate the received signal and generate values corresponding to an LDPC codeword.

The values corresponding to the LDPC codeword may be expressed to be channel values of the received signal. Methods determining the channel values may be various. For example, a method determining Log Likelihood Ratio (LLR) values may be used.

The LLR values may be obtained by log-functionalizing a ratio of a probability of bits transmitted from the transmitter 100 being 0 and a probability of the bits being 1. Further, the LLR values may be bit values determined according to a hard decision, or representative values determined according to sections of a probability of transmitted bits from the transmitter 100 being 0 or 1.

In this case, the demodulator 610 may determine LLR values corresponding to the information word bits and the first parity bits and LLR values corresponding to the second parity bits. Further, the demodulator 610 may output the determined LLR values to the de-interleaver 620.

The de-interleaver 620 may perform de-interleaving on the output values of the demodulator 610. For the above, the de-interleaver 620 may include a first de-interleaver 621 and a second de-interleaver 623, which respectively correspond to the first interleaver 121 and the second interleaver 123 of FIG. 1.

The demodulator 610 may output LLR values corresponding to the information word bits and the first parity bits to the first de-interleaver 621 and the LLR values corresponding to the second parity bits to the second de-interleaver 623.

In this case, the first de-interleaver 621 may de-interleave the LLR values corresponding to the information word bits and the first parity bits, and the second de-interleaver 623 may de-interleave the LLR values corresponding to the second parity bits. Here, the first de-interleaver 621 and the second de-interleaver 623 may respectively perform a reverse operation to the interleaving performed by the first interleaver 121 and the second interleaver 123, and output the de-interleaved LLR values to the decoder 630.

The decoder 630 may perform decoding on the output values of the de-interleaver 620. The decoder 630 may correspond to the encoder 110 of FIG. 1. For the above, the decoder 630 may include an LDPC decoder (not illustrated) for LDPC decoding.

The de-interleaver 620 may de-interleave the LLR values corresponding to LDPC codeword bits, and output to the decoder 630. The decoder 630 may perform LDPC decoding based on the de-interleaved LLR values.

For example, the decoder 630 may perform LDPC decoding by using an iterative decoding method based on a sum-product algorithm. The sum-product algorithm may be one of message passing algorithms. The message passing algorithms may indicate algorithms in which messages are interchanged through an edge on a bipartite graph, and output messages are calculated and updated from the messages input from variable nodes or check nodes.

In this case, the decoder 630 may use a parity check matrix when performing the LDPC decoding. For example, the parity check matrix may have the structure of FIGS. 2 and 3, and information about the parity check matrix may be previously stored in the receiver 600 or provided from the transmitter 100.

Therefore, the decoder 630 may correct errors in the information word bits (i.e., data) transmitted from the transmitter 100, and generate the information word bits of which errors are corrected.

When certain bits of the second parity bits are punctured in the transmitter 100, the decoder 630 may remove a submatrix corresponding to the certain bits of the second parity bits which are removed by the puncturing in the parity submatrix, and perform the decoding by using the remaining part in the parity submatrix. For example, the decoder 630 may remove a submatrix corresponding to the second parity bits punctured in the parity submatrix (320-3) having the identity matrix structure, and perform the decoding.

Figure 7:
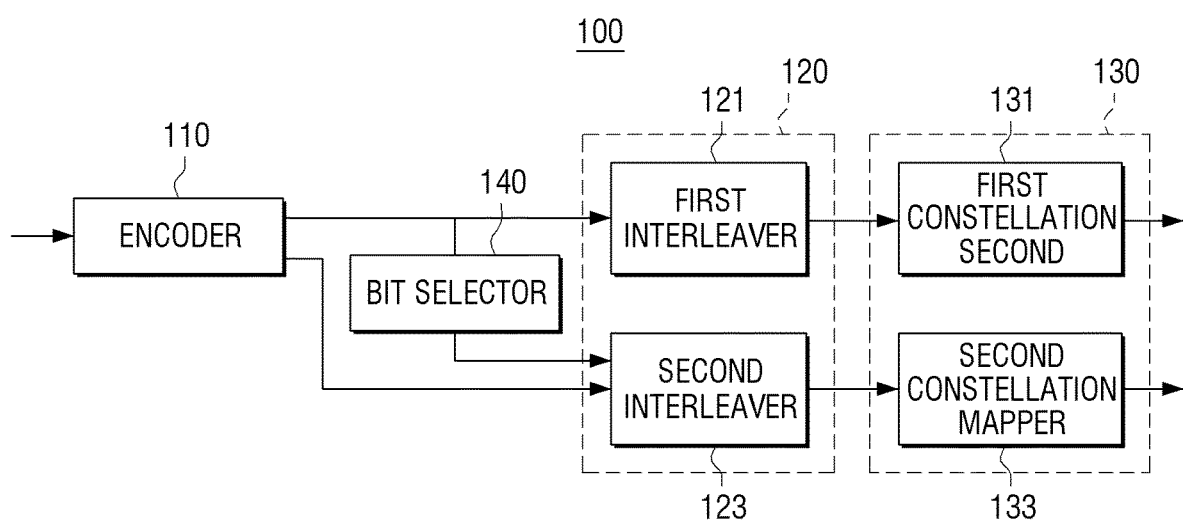

FIG. 7 is a block diagram of a transmitter, according to an exemplary embodiment. Referring to FIG. 7, the transmitter 100 may include the encoder 110, the interleaver 120, the constellation mapper 130, and a bit selector 140. The encoder 110, the interleaver 120, and the constellation mapper 130 of FIG. 7 perform the same functions as those of FIG. 1, which will not be specifically described below due to redundancy.

When the transmitter 100 of FIG. 7 generates an LDPC codeword based on the parity check matrix (400, 500) having the structure of FIG. 4 or 5, the bits included in the originally encoded data may be transmitted when the additional parity is transmitted.

Thus, the transmitter 100 may additionally use certain bits of the information word bits and/or the first parity bits, when modulation symbols of the second parity bits are generated. For the above, the transmitter 100 may further include the bit selector 140.

The bit selector 140 may output certain bits from the information word bits and the first parity bits to the second interleaver 133 so that the certain bits from the information word bits and the first parity bits, along with the second parity bits, are mapped on constellation points. For the above, the encoder 110 may output the information word bits and the first parity bits generated by LDPC encoding to the bit selector 140.

The bit selector 140 may select certain bits from the information word bits and the first parity bits based on the ratio of the sum of the number of the information word bits and the first parity bits to the number of the second parity bits, and output the selected bits to the second interleaver 123. In this case, the selected bits may be constituted only with the information word bits, or only with the first parity bits, or with the information word bits and the first parity bits.

For example, it is assumed that C, a value of dividing the sum of the number of the information word bits and the first parity bits by the number of the second parity bits is an integer of 1 or more. Here, C+1 may be a multiple of the number of bits ($\eta$ mod) constituting a modulation symbol.

In this case, the bit selector 140 may select $N_{p2} \times$number of bits from the information word bits and the first parity bits, and output to the second interleaver 123. Here, $N_{p2}$ may be an integer less than the number of the second parity bits generated by LDPC encoding. When the encoder 110 punctures the second parity bits, $N_{p2}$ may be the number of the second parity bits remaining after the puncturing. When the encoder 110 does not puncture the second parity bits, $N_{p2}$ may be the same as the number of the second parity bits.

Thus, when the bit selector 140 selects $N_{p2} \times C$ number of bits from the information word bits and the first parity bits, and outputs to the second interleaver 123, the second interleaver 123 may interleave $N_{p2} \times C$ number of bits with $N_{p2}$ number of the second parity bits delivered from the encoder 110, and output to the second constellation mapper 133. The second constellation mapper 133 may map $N_{p2} \times (C+1)$ number of bits in total on constellation points. As a result, modulation symbols generated based on $N_{p2} \times (C+1)$ number of bits may be transmitted as an additional parity. Thus, C+1 should be a multiple of η mod by considering that $N_{p2} \times (C+1)$ number of bits may be mapped on constellation points. In this case, the selected bit group may be constituted with the information word bits and/or the first parity bits.

Further, the bit selector 140 may select a group of certain bits from the information word bits and the first parity bits based on a ratio of a sum of the number of the information word bits and the first parity bits to the number of the second parity bits. The bit selector 140 may output the selected bit group to the second interleaver 123.

Herein, the bit group may be constituted with M (i.e., an interval in which a column pattern repeats in the parity check matrix; for example, M may be 360) number of bits.

For example, it is assumed that the information word bits and the first parity bits may be constituted with A number of bit groups and the second parity bits may be constituted with B number of bit groups. In other words, it is assumed that the sum of the number of the information word bits and the first parity bits may be A×M, and the number of the, second parity bits may be B×M:

In this case, the bit selector 140 may select $$\left\lfloor \frac{A}{B} \right\rfloor$$

number of bit groups from the information word bits and the first parity bits, and output to the second interleaver 123. Herein, $$\left\lfloor \frac{A}{B} \right\rfloor$$

may be a maximum integer less than A/B. Thus, the bit selector 140 may output $$\left\lfloor \frac{A}{B} \right\rfloor \times M$$

number of bits to the second interleaver 123.

Thus, when the bit selector 140 selects $$\left\lfloor \frac{A}{B} \right\rfloor$$

number of bit groups from the information word bits and the first parity bits and outputs to the second interleaver 123, the second interleaver 123 may interleave $$\left\lfloor \frac{A}{B} \right\rfloor$$

number of bit groups with B number of bit groups delivered from the encoder 110, and output to the second constellation mapper 133. The second constellation mapper 133 may map $$\left( \left\lfloor \frac{A}{B} \right\rfloor + 1 \right)$$

number of bit groups, $$\text{i.e., } M \times \left( \left\lfloor \frac{A}{B} \right\rfloor + 1 \right)$$

number of bits on constellation points.

As a result, modulation symbols generated based on $$M \times \left( \left\lfloor \frac{A}{B} \right\rfloor + 1 \right)$$

number of bits may be transmitted as additional parity bits. Here, M may be a multiple of η mod.

The above embodiment describes that the bit selector 140 may select $$\left\lfloor \frac{A}{B} \right\rfloor$$

number of bit groups. However, this is merely one of exemplary embodiments. In cases, the bit selector 140 may select an integer number less than $$\left\lfloor \frac{A}{B} \right\rfloor$$

of the bit groups.

According to the above method, a coding gain according to the IR method can be obtained by transmitting the additional parity. The additionally transmitted parity may be generated with the submatrices having relatively smaller size, and used with parts of the encoded data initially transmitted. Therefore, the complexity can be reduced in LDCP encoding and decoding.

Figure 8:
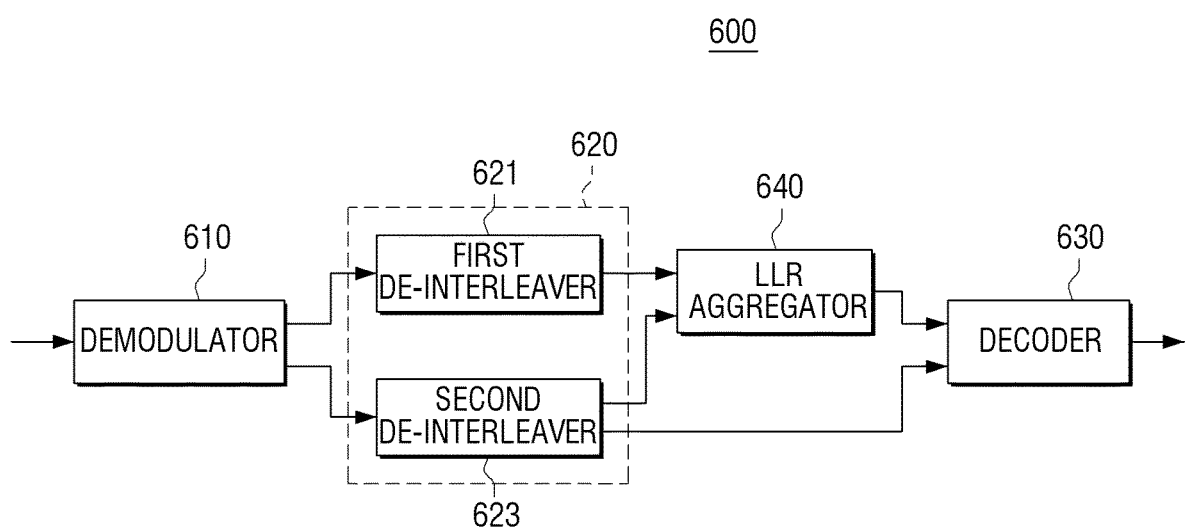

FIG. 8 is a block diagram of the receiver according to an embodiment. Referring to FIG. 8, the receiver 600 may include the demodulator 610, the de-interleaver 620, the decoder 630 and LLR aggregator 640. The demodulator 610, the de-interleaver 620, and the decoder 630 of FIG. 8 may perform the uniform functions to those of FIG. 6, which will not be specifically explained below in view of the overlapping.

The demodulator 610 may determine LLR values as described in FIG. 6. In this case, the transmitter 100 of FIG. 7 may transmit certain bits from the information word bits and the first parity bits as additional parity with the second parity bits. Thus, the demodulator 610 may determine LLR values regarding the information word bits and the first parity bits, and LLR values regarding certain bits from the information word bits and the first parity bits, and the second parity bits.

An LLR aggregator 640 may aggregate the values outputted from the first de-interleaver 621 and the second de-interleaver 623, and output to the decoder 630. Herein, the first de-interleaver 621 may de-interleave and output LLR values corresponding to the information word bits and the first parity bits, and de-interleave and output LLR values corresponding to the certain bits from the information word bits and the first parity bits, and the second parity bits.

Therefore, LLR aggregator 640 may aggregate LLR values regarding the information word bits and the first parity bits delivered from the first de-interleaver 621 with LLR values regarding the certain bits from the information word bits and the first parity bits delivered from the second de-interleaver 623.

For example, when the transmitter 100 uses certain bits from the first parity bits and the second parity bits during transmission of the additional parity bits, LLR aggregator 640 may aggregate LLR values regarding the certain bits from the first parity bits with LLR values regarding the first parity bits.

As described above in FIG. 7, because the transmitter 100 may use the certain bits from the information word bits and the first parity bits in order to transmit the second parity bits additionally, LLR aggregator 640 may aggregate LLR values regarding the certain bits from the information word bits and the first parity bits which are determined regarding the additional parity with LLR values regarding the information word bits and the first parity bits which are determined regarding the encoded data originally, and output to the decoder 630.

Thereby, the decoder 630 may use LLR values delivered from LLR aggregator 640 when performing LDPC decoding. In this case, the decoder 630 may perform LDPC decoding based on the parity check matrix 500 having the structure of FIG. 4 or 5.

Figure 9:
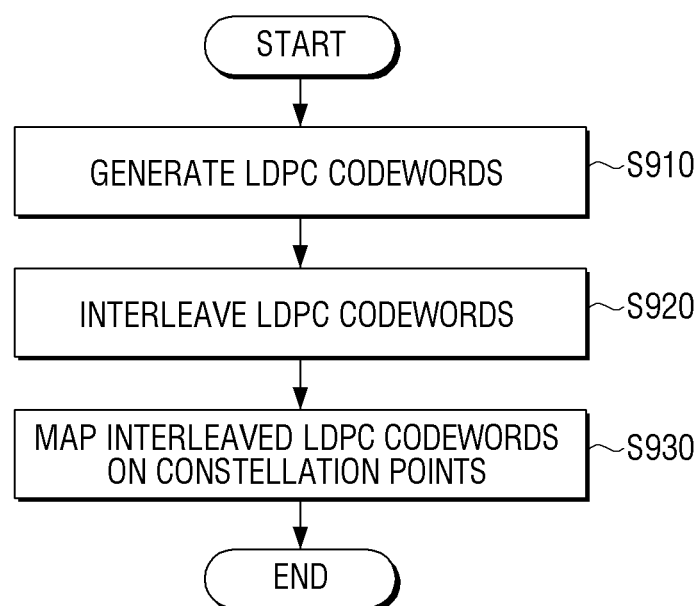
FIG. 9 is a flowchart provided to explain a signal processing method of a transmitter according to an exemplary embodiment.

FIG. 9 is a flowchart provided to explain a signal processing method of a transmitter, according to an exemplary embodiment.

An operation at S910 may generate an LDPC codeword including information word bits, first parity bits and second parity bits based on a parity check matrix.

An operation at S920 may interleave the LDPC codeword.

An operation at S930 may map the interleaved LDPC codeword on constellation points.

The parity check matrix may include an information word submatrix and a parity submatrix, and the information word submatrix may be constituted with a plurality of column groups respectively including M number of columns. Positions of 1 in a $0^{th}$ column of each of the plurality of the column groups may be indicated in Table 4 described above.

The parity check matrix may include four parity submatrices. Among the four parity submatrices, two parity submatrices which are not concatenated with each other may have a dual diagonal matrix structure, and the other two parity submatrices may be zero matrices. For example, the parity check matrix may have the structure of FIG. 2.

In this case, the first parity bits may be generated based on one of the parity submatrices having the dual diagonal structure, and the second parity bits may be generated based on the other of the parity submatrices having the dual diagonal structure.

The operation at S910 may generate the first parity bits by using Equation 11, and generate the second parity bits by using Equation 12.

The parity check matrix may include the four parity submatrices. One of the four parity submatrices may have the dual diagonal matrix structure, another may have the identity matrix structure, and the other two parity submatrices may be zero matrices. For example, the parity check matrix may have the structure of FIG. 3.

In this case, the first parity bits may be generated based on the parity submatrix having the dual diagonal structure, and the second parity bits may be generated based on the parity submatrix having the identity matrix structure.

The operation at S910 may generate the first parity bits by using Equation 13 and the second parity bits by using Equation 14 discussed above.

The operation at S920 may interleave the information word bits and the first parity bits by using the first interleaver and the second parity bits by using the second interleaver.

In this case, the operation at S930 may map an output of the first interleaver on constellation points by using a first constellation mapper, and an output of the second interleaver on constellation points by using a second constellation mapper.

Further, the signal processing method may include outputting certain bits from the information word bits and the first parity bits to the second interleaver in order to map the certain bits from the information word bits and the first parity bits along with the second parity bits on constellation points. In this case, the bit numbers of the second parity bits may be smaller than the bit numbers of the first parity bits.

Specifically, the certain bits may be selected from the information word bits and the first parity bits based on a ratio of a sum of bit numbers in the information word bits and the first parity bits to bit numbers of the second parity bits, and the selected bits may be output to the second interleaver.

Further, a group of the certain bits may be selected from the information word bits and the first parity bits based on the ratio of the sum of the bit numbers in the information word bits and the first parity bits to the bit numbers of the second parity bits, and the selected bit group may be output to the second interleaver.

The above method is described by referring to FIGS. 1 to 8, which will not be further provided.

The operations or steps of the methods or algorithms described above in reference to FIG. 9 can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

At least one of the components, elements or units represented by a block as illustrated in FIGS. 1 and 6-8 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

Further, the foregoing exemplary embodiments and advantages are merely exemplary and are not to be construed as limiting the inventive concept. The present teaching can be readily applied to other types of apparatuses. Also, the description of the exemplary embodiments of the inventive concept is intended to be illustrative, and not to limit the scope of the claims.

What is claimed is:

1. A receiving apparatus comprising:
   a demodulator configured to demodulate a signal received from a transmitting apparatus to generate values;
   a deinterleaver configured to deinterleave the values; and
   a decoder configured to decode the deinterleaved values based on a parity check matrix of a low density parity check (LDPC) code,
   wherein the signal is generated based on encoding information bits based on the parity check matrix to generate first parity bits and second parity bits,
   wherein the parity check matrix comprises an information matrix part and a parity matrix part,
   wherein the information matrix part comprises a first information submatrix with a quasi-cyclic structure and a second information submatrix with the quasi-cyclic structure,
   wherein the parity matrix part comprises a first parity submatrix with a dual diagonal matrix structure and a second parity submatrix with an identity matrix structure,
   wherein the first parity bits are generated based on the first parity submatrix, and
   wherein the second parity bits are generated based on the second parity submatrix,
   wherein each of the first and second information submatrices comprises a plurality of column groups,
   wherein in each column group of the first information submatrix, a column is cyclic-shifted from a previous column by a first cyclic shift value, and in each column group of the second information submatrix, a column is cyclic-shifted from a previous column by a second cyclic shift value different from the first cyclic shift value.

2. The apparatus of claim 1, wherein each of the plurality of column groups comprises M number of columns.

3. The apparatus of claim 2, wherein M is a common divisor of Nldpc1, Nldpc2, and Kldpc, and satisfies a following equation:

$$M=(Nldpc1-Kldpc)/Qldpc1=(Nldpc2-Kldpc)/Qldpc2,$$

where, Qldpc1 is a cyclic-shift value in one of the first and second information submatrices, Nldpc1−Kldpc is a number of rows constituting the one of the first and second information submatrices, Qldpc2 is a cyclic-shift value in the other of the first and second information submatrices, and Nldpc2−Kldpc is a number of rows constituting the other information submatrix.

4. The apparatus of claim 1, wherein, in each of the first and second information submatrices, an index of a row having a kth 1 in a jth column in an ith column group is determined based on a number of rows having 1 in a column, a number of columns in each column group, a number of information bits, a number of the first parity bits, a number of the second parity bits, and the first and second cyclic shift values, and
   wherein i, j and k are an integer value greater than or equal to 0.

5. The apparatus of claim 4, wherein if an index of a row in a 0th column of a given column group is less than the number of the first parity bits, indexes of rows having 1 in a next column group are determined by the first cyclic-shift value, and
   wherein if the index of the row in the 0th column of the given column group is greater than or equal to the number of the first parity bits, the indexes of the rows having 1 in the next column group are determined by the second cyclic-shift value.

6. A receiving method comprising:
   demodulating a signal received from a transmitting apparatus to generate values;
   deinterleaving the values; and
   decoding the deinterleaved values based on a parity check matrix of a low density parity check (LDPC) code,
   wherein the signal is generated based on encoding information bits based on the parity check matrix to generate first parity bits and second parity bits,
   wherein the parity check matrix comprises an information matrix part and a parity matrix part,
   wherein the information matrix part comprises a first information submatrix with a quasi-cyclic structure and a second information submatrix with the quasi-cyclic structure,
   wherein the parity matrix part comprises a first parity submatrix with a dual diagonal matrix structure and a second parity submatrix with an identity matrix structure,
   wherein the first parity bits are generated based on the first parity submatrix, and
   wherein the second parity bits are generated based on the second parity submatrix,
   wherein each of the first and second information submatrices comprises a plurality of column groups,
   wherein in each column group of the first information submatrix, a column is cyclic-shifted from a previous column by a first cyclic shift value, and in each column group of the second information submatrix, a column is cyclic-shifted from a previous column by a second cyclic shift value different from the first cyclic shift value.

7. The method of claim 6, wherein each of the plurality of column groups comprises M number of columns.

8. The method of claim 7, wherein M is a common divisor of Nldpc1, Nldpc2, and Kldpc, and satisfies a following equation:

$$M=(Nldpc1-Kldpc)/Qldpc1=(Nldpc2-Kldpc)/Qldpc2,$$

where, Qldpc1 is a cyclic-shift value in one of the first and second information submatrices, Nldpc1−Kldpc is a number of rows constituting the one of the first and second information submatrices, Qldpc2 is a cyclic-shift value in the other of the first and second information submatrices, and Nldpc2−Kldpc is a number of rows constituting the other information submatrix.

9. The method of claim 6, wherein, in each of the first and second information submatrices, an index of a row having a kth 1 in a jth column in an ith column group is determined based on a number of rows having 1 in a column, a number of columns in each column group, a number of information bits, a number of the first parity bits, a number of the second parity bits, and the first and second cyclic shift values, and wherein i, j and k are an integer value greater than or equal to 0.

10. The method of claim 9, wherein if an index of a row in a 0th column of a given column group is less than the number of the first parity bits, indexes of rows having 1 in a next column group are determined by the first cyclic-shift value, and wherein if the index of the row in the 0th column of the given column group is greater than or equal to the number of the first parity bits, the indexes of the rows having 1 in the next column group are determined by the second cyclic-shift value.

* * * * *